United States Patent
Kim et al.

(10) Patent No.: US 12,324,304 B2
(45) Date of Patent: Jun. 3, 2025

(54) DISPLAY PANEL AND METHOD OF PROVIDING THE SAME

(71) Applicant: Samsung Display Co., LTD., Yongin-si (KR)

(72) Inventors: Jiyoon Kim, Seongnam-si (KR); Youngmo Koo, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 526 days.

(21) Appl. No.: 17/567,207

(22) Filed: Jan. 3, 2022

(65) Prior Publication Data

US 2022/0407030 A1  Dec. 22, 2022

(30) Foreign Application Priority Data

Jun. 16, 2021  (KR) ........................ 10-2021-0077743

(51) Int. Cl.

| | |
|---|---|
| *H10K 50/824* | (2023.01) |
| *H10K 50/16* | (2023.01) |
| *H10K 50/17* | (2023.01) |
| *H10K 50/828* | (2023.01) |
| *H10K 71/00* | (2023.01) |
| *H10K 59/12* | (2023.01) |
| *H10K 59/122* | (2023.01) |
| *H10K 102/00* | (2023.01) |

(52) U.S. Cl.
CPC .......... *H10K 50/824* (2023.02); *H10K 50/16* (2023.02); *H10K 50/171* (2023.02); *H10K 50/828* (2023.02); *H10K 71/00* (2023.02); *H10K 59/1201* (2023.02); *H10K 59/122* (2023.02); *H10K 2102/351* (2023.02)

(58) Field of Classification Search
None
See application file for complete search history.

(56) References Cited

U.S. PATENT DOCUMENTS

| | | | |
|---|---|---|---|
| 10,516,133 B2 | 12/2019 | Nishimura et al. | |
| 2018/0374909 A1* | 12/2018 | Nishikiori | H10K 59/122 |
| 2020/0227661 A1* | 7/2020 | Nishikiori | H10K 71/00 |
| 2021/0043706 A1* | 2/2021 | Kobayashi | H10K 50/15 |
| 2021/0210571 A1* | 7/2021 | Zhang | H10K 50/824 |

FOREIGN PATENT DOCUMENTS

| | | |
|---|---|---|
| JP | 2009283304 A | 12/2009 |
| JP | 6789184 B2 | 11/2020 |
| KR | 100683791 B1 | 2/2007 |
| KR | 102079251 B1 | 4/2020 |

* cited by examiner

*Primary Examiner* — Michelle Mandala
(74) *Attorney, Agent, or Firm* — CANTOR COLBURN LLP

(57) ABSTRACT

A display panel includes a pixel electrode, a common electrode which faces the pixel electrode, an auxiliary electrode spaced apart from the pixel electrode and connected to the common electrode, and a first functional layer between the pixel electrode and the common electrode, the first functional layer extending from the pixel electrode to the auxiliary electrode. The common electrode which is connected to the auxiliary electrode includes in order in a direction away from the first functional layer, a first layer including a transparent conductive material and having a thickness of about 500 angstroms to about 6000 angstroms, and a second layer including a conductive material and having a thickness of about 10 angstroms to about 100 angstroms.

22 Claims, 20 Drawing Sheets

DISPLAY PANEL AND METHOD OF PROVIDING THE SAME

This application claims priority to Korean Patent Application No. 10-2021-0077743 filed on Jun. 16, 2021, and all the benefits accruing therefrom under 35 U.S.C. § 119, which is hereby incorporated by reference for all purposes as if fully set forth herein.

BACKGROUND

1. Field

Embodiments relate to a display panel and method of providing the same.

2. Description of the Related Art

Flat panel display devices are replacing cathode ray tube display devices as display devices due to their lightweight and thin characteristics. As representative examples of such flat panel display devices, there are liquid crystal display devices and organic light emitting diode display devices.

In a top emission type organic light emitting display panel, light generated from an emission layer may be emitted toward a common electrode.

SUMMARY

In a top emission type organic light emitting display panel where light generated from an emission layer is emitted toward a common electrode, a thickness of the common electrode may be small to transmit the light. However, a voltage drop (IR drop) of a voltage applied to the common electrode may occur. Accordingly, a display quality of the display panel may be reduced. In addition, when an auxiliary electrode electrically connected to the common electrode is provided to prevent or reduce the voltage drop, a cost and a time of providing (or manufacturing) the display panel may increase.

Embodiments provide a display panel with improved display quality.

Embodiments also provide a method of providing (or manufacturing) a display panel with reduced cost and time.

Additional features will be set forth in the description which follows, and in part will be apparent from the description, or may be learned by practice of the embodiments.

An embodiment of a display panel includes a substrate, a pixel electrode on the substrate, an auxiliary electrode spaced apart from the pixel electrode, a first functional layer on each of the pixel electrode and the auxiliary electrode, and a common electrode including a first layer and a second layer. The first layer may be on the first functional layer, include a transparent conductive material, and have a thickness of about 500 angstroms (Å) to about 6000 Å. The second layer may be on the first layer, include a conductive material, and have a thickness of about 10 Å to about 100 Å.

In an embodiment, the auxiliary electrode may have a first thickness, and the first functional layer may have a second thickness which is less than the first thickness.

In an embodiment, a difference between the first thickness and the second thickness may be about 500 Å to about 6000 Å.

In an embodiment, the first functional layer may expose a portion of a side surface of the auxiliary electrode to outside the first functional layer. The first layer may contact the portion of the side surface of the auxiliary electrode which is exposed by the first functional layer.

In an embodiment, the auxiliary electrode may have a taper angle of about 80 degrees to about 90 degrees.

In an embodiment, the auxiliary electrode may include a material different from the pixel electrode.

In an embodiment, the auxiliary electrode may include copper (Cu) or molybdenum (Mo).

In an embodiment, the auxiliary electrode may include a same material as the pixel electrode.

In an embodiment, the first functional layer may include at least one of an electron injection layer and an electron transport layer.

In an embodiment, the display panel may further include an emission layer between the pixel electrode and the first functional layer and spaced apart from the auxiliary electrode, and a second functional layer between the pixel electrode and the emission layer and spaced apart from the auxiliary electrode.

In an embodiment, the second functional layer may include at least one of a hole injection layer and a hole transport layer.

A method of providing a display panel includes providing a pixel electrode and an auxiliary electrode spaced apart from each other on a substrate, providing a functional layer on the pixel electrode and the auxiliary electrode to overlap each of the pixel electrode and the auxiliary electrode, providing a first layer having a thickness of about 500 Å to about 6000 Å by depositing a transparent conductive material on the functional layer, and providing a second layer having a thickness of about 10 Å to about 100 Å by depositing a conductive material on the first layer.

In an embodiment, the providing of the pixel electrode and the auxiliary electrode may include forming a first conductive layer including a first material on the substrate, providing the auxiliary electrode by partially removing the first conductive layer through a first etching process, providing a second conductive layer including a second material different from the first material on the substrate and the auxiliary electrode, and providing the pixel electrode spaced apart from the auxiliary electrode by partially removing the second conductive layer through a second etching process.

In an embodiment, the second conductive layer may have a first etching rate for the second etching process. The auxiliary electrode may have a second etching rate lower than the first etching rate for the second etching process.

In an embodiment, the second material may include copper (Cu) or molybdenum (Mo).

In an embodiment, the providing of the pixel electrode and the auxiliary electrode may include providing a conductive layer on the substrate and providing the pixel electrode and the auxiliary electrode by partially removing the conductive layer through an etching process.

In an embodiment, the auxiliary electrode may have a first thickness, and the functional layer may have a second thickness which is less than the first thickness.

In an embodiment, a difference between the first thickness and the second thickness may be about 500 Å to about 6000 Å.

In an embodiment, the functional layer may be providing by a vacuum deposition, and the first layer may be providing by a sputtering.

In an embodiment, the functional layer may expose a portion of a side surface of the auxiliary electrode to outside the functional layer. The first layer may contact the portion of the side surface of the auxiliary electrode which is exposed by the functional layer.

One or more embodiment of the display panel may include the auxiliary electrode electrically connected to the common electrode. The auxiliary electrode may prevent or reduce an IR drop of a voltage applied to the common electrode. Accordingly, a display quality of the display panel may be improved.

It is to be understood that both the foregoing general description and the following detailed description are explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the embodiments.

DETAILED DESCRIPTION

Figure 1:
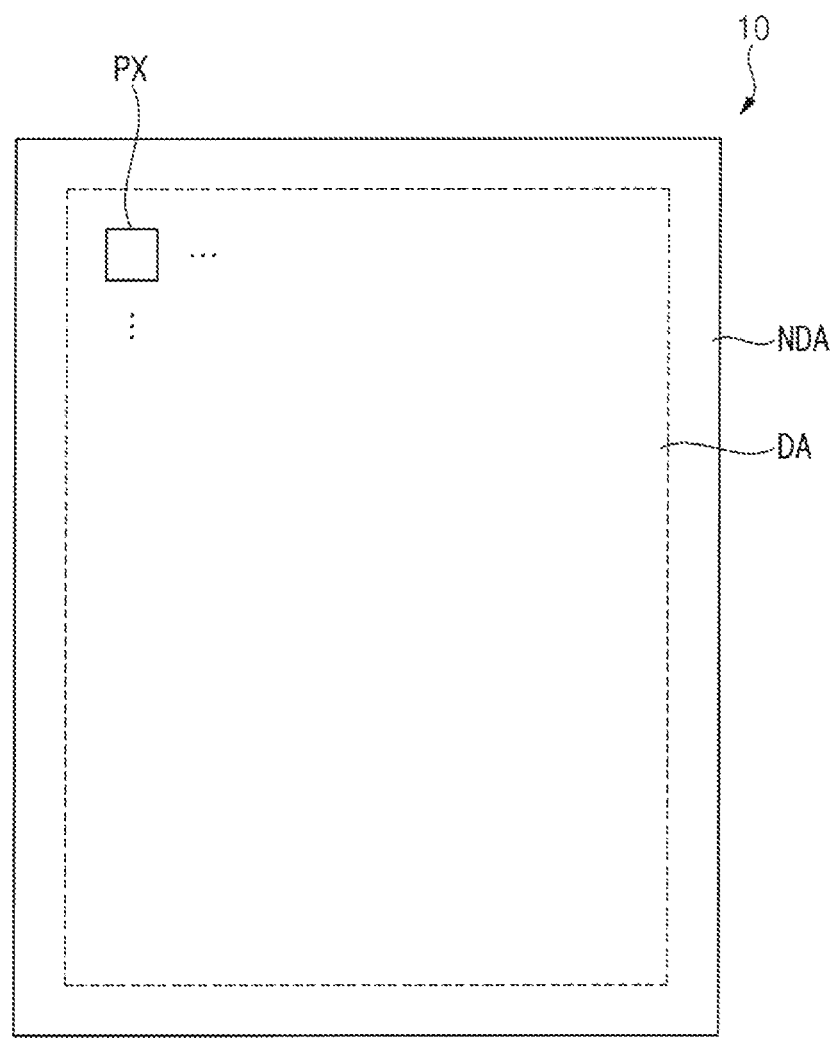
FIG. 1 is a plan view illustrating an embodiment of a display panel.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout. As used herein, a reference number may indicate a singular element or a plurality of the element. For example, a reference number labeling a singular form of an element within the drawing figures may be used to reference a plurality of the singular element within the text of specification.

It will be understood that when an element is referred to as being related to another element such as being "on" another element, it can be directly on the other element or intervening elements may be present therebetween. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Illustrative, non-limiting embodiments will be more clearly understood from the following detailed description in conjunction with the accompanying drawings.

Figure 2:
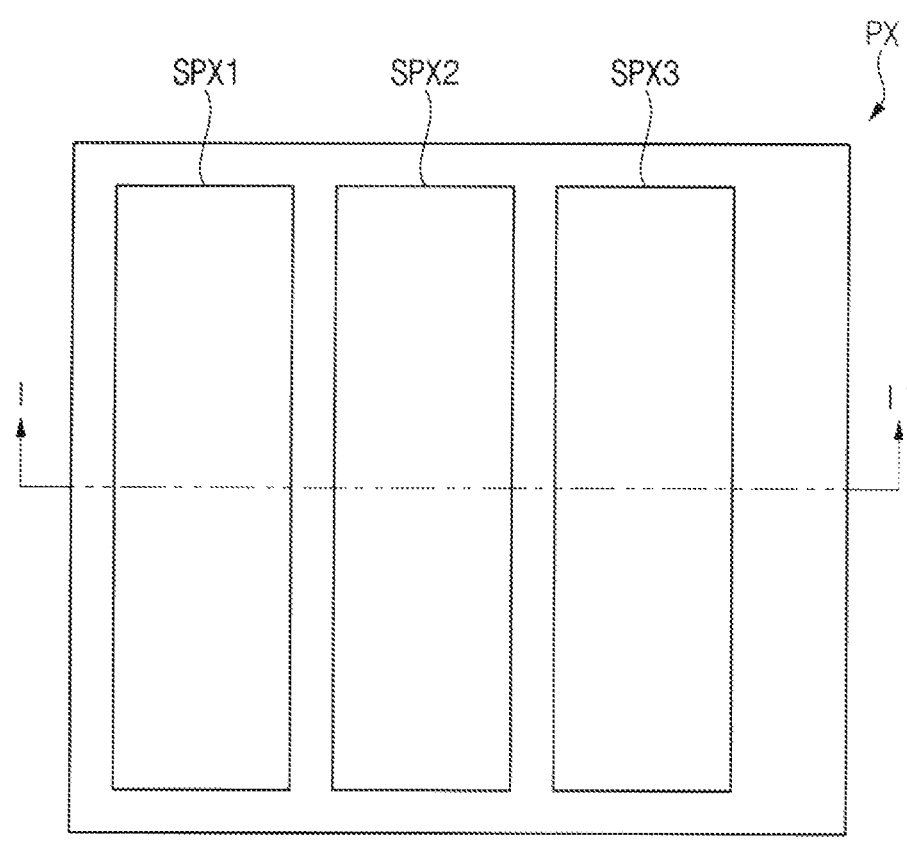
FIG. 2 is a plan view illustrating an embodiment of a pixel included in the display panel of FIG. 1.

FIG. 1 is a plan view illustrating an embodiment of a display panel 10. FIG. 2 is a plan view illustrating an embodiment of a pixel PX included in the display panel 10 of FIG. 1.

Referring to FIGS. 1 and 2, a display panel 10 may include a display area DA and a non-display area NDA. An image may be displayed in the display area DA. The non-display area NDA may be adjacent to the display area DA, such as being around the display area DA.

The display panel 10 may include a pixel PX provided in plural including a plurality of pixels PX disposed in the display area DA. In an embodiment, for example, the pixels PX may be arranged in a matrix form along a first direction and a second direction which crosses the first direction, such as being perpendicular to the first direction, without being limited thereto. In FIGS. 1 and 2, a first direction may be represented along the horizontal direction, while a second direction crossing the first direction may be represented along the vertical direction. A thickness direction of the display panel 10 and various components or layers thereof may be taken along a third direction crossing each of the first direction and the second direction.

Each of the pixels PX may include a plurality of sub-pixels respectively emitting light of different colors. In an embodiment, each of the pixels PX may include first to third sub-pixels SPX1, SPX2, and SPX3 emitting light of different colors. In an embodiment, for example, the first sub-pixel SPX1 may emit red light, the second sub-pixel SPX2 may emit green light, and the third sub-pixel SPX3 may emit blue light, but embodiments are not limited thereto.

Each of the first to third sub-pixels SPX1, SPX2, and SPX3 may include a thin film transistor 200 and a light emitting element 300 as a display element which is connected to the thin film transistor 200. The thin film transistor 200 may generate a driving (electrical) current and provide the generated driving current to the light emitting element 300. The light emitting element 300 may emit light based on the driving current. In an embodiment, for example, the light emitting element 300 may include (or may be) an organic light emitting diode, an inorganic light emitting diode, a quantum dot light emitting diode, or the like.

Figure 3:
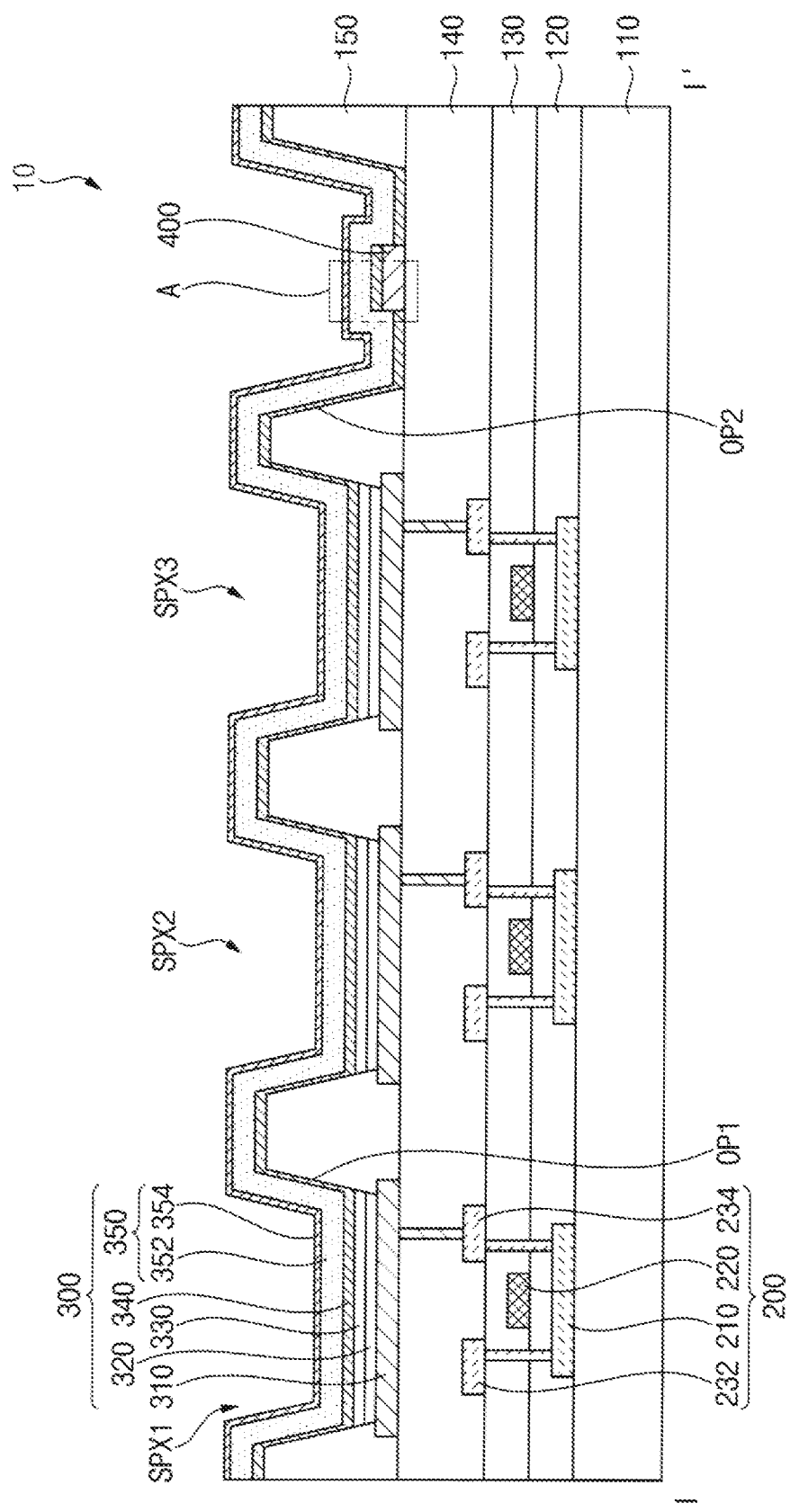
FIG. 3 is a cross-sectional view taken along line I-I' of FIG. 2.

FIG. 3 is a cross-sectional view taken along line I-I' of FIG. 2.

Referring to FIGS. 2 and 3, in an embodiment, the display panel 10 may include a substrate 110, the first sub-pixel SPX1, the second sub-pixel SPX2, the third sub-pixel SPX3, and an auxiliary electrode 400. The first sub-pixel SPX1 may include the thin film transistor 200 and the light emitting element 300. The thin film transistor 200 may include an active layer 210, a gate electrode 220, a source electrode 232, and a drain electrode 234. The light emitting element 300 may include a pixel electrode 310 (e.g., first electrode), a first functional layer 320, an emission layer 330, a second functional layer 340, and a common electrode 350 (e.g., second electrode), in order in a direction away from the substrate 110. Within the display element, the first electrode (e.g. faces the second electrode with the first functional layer 320 therebetween. Each of the second sub-pixel SPX2 and the third sub-pixel SPX3 may have a structure substantially the same as or similar to that of the first sub-pixel SPX1.

The substrate 110 may be an insulating substrate including (or formed) of a transparent or opaque material. In an embodiment, the substrate 110 may include a glass. In this case, the display panel 10 may be a rigid display panel. In an embodiment, the substrate 110 may include a plastic. In this case, the display panel 10 may be a flexible display panel.

The active layer 210 may be disposed on the substrate 110. The active layer 210 may include an oxide semiconductor, a silicon semiconductor, an organic semiconductor, or the like. In an embodiment, for example, the oxide semiconductor may include at least one oxide of indium (In), gallium (Ga), tin (Sn), zirconium (Zr), vanadium (V), hafnium (Hf), cadmium (Cd), germanium (Ge), chromium (Cr), titanium (Ti), and zinc (Zn). The silicon semiconductor may include an amorphous silicon, a polycrystalline silicon, or the like. The active layer 210 may include a source area, a drain area, and a channel area positioned between the source area and the drain area.

In an embodiment, a buffer layer (not shown) may be disposed between the substrate 110 and the active layer 210. The buffer layer may prevent (or effectively reduce) impurities such as oxygen or moisture from diffusing into the active layer 210 from the substrate 110. The buffer layer may include an inorganic insulating material such as a silicon compound, a metal oxide, or the like. Examples of the inorganic insulating material that can be used for the buffer layer may include silicon oxide (SiO), silicon nitride (SiN), silicon oxynitride (SiON), silicon oxycarbide (SiOC), silicon carbonitride (SiCN), aluminum oxide (AlO), aluminum nitride (AlN), tantalum oxide (TaO), hafnium oxide (HfO), zirconium oxide (ZrO), titanium oxide (TiO), or the like. These can be used alone or in a combination thereof. The buffer layer may have a single-layered structure or a multi-layered structure including a plurality of insulating layers.

A first insulating layer 120 may be disposed on the active layer 210. The first insulating layer 120 may cover the active layer 210 on the substrate 110. The first insulating layer 120 may include an inorganic insulating material.

The gate electrode 220 may be disposed on the first insulating layer 120. The gate electrode 220 may overlap the channel area of the active layer 210. The gate electrode 220 may include a conductive material such as a metal, an alloy, a conductive metal nitride, a conductive metal oxide, a transparent conductive material, or the like. Examples of the conductive material that can be used for the gate electrode 220 may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Ir), alloys containing aluminum, alloys containing silver, alloys containing copper, alloys containing molybdenum, aluminum nitride (AlN), tungsten nitride (WN), titanium nitride (TiN), chromium nitride (CrN), tantalum nitride (TaN), strontium ruthenium oxide (SrRuO), zinc oxide (ZnO), indium tin oxide (ITO), tin oxide (SnO), indium oxide (InO), gallium oxide (GaO), indium zinc oxide (IZO), or the like. These can be used alone or in a combination thereof. The gate electrode 220 may have a single-layered structure or a multi-layered structure including a plurality of conductive layers.

A second insulating layer 130 may be disposed on the gate electrode 220. The second insulating layer 130 may cover the gate electrode 220 on the first insulating layer 120. The second insulating layer 130 may include an inorganic insulating material.

The source electrode 232 and the drain electrode 234 may be disposed on the second insulating layer 130. The source electrode 232 and the drain electrode 234 may be connected to the source area and the drain area of the active layer 210, respectively. Each of the source electrode 232 and the drain electrode 234 may include a conductive material.

A third insulating layer 140 may be disposed on the source electrode 232 and the drain electrode 234. The third insulating layer 140 may include an organic insulating material. Examples of the organic insulating material that can be used for the third insulating layer 140 may include a photoresist, a polyacryl-based resin, a polyimide-based resin, a polyamide-based resin, a siloxane-based resin, an acryl-based resin, an epoxy-based resin, or the like. These can be used alone or in a combination thereof. In an embodiment, the third insulating layer 140 may have a single-layered structure or a multi-layered structure including a plurality of insulating layers.

The pixel electrode 310 may be disposed on the third insulating layer 140. The pixel electrode 310 may be connected to the drain electrode 234 at (or through) a contact hole formed in the third insulating layer 140. Accordingly, the pixel electrode 310 may be electrically connected to the thin film transistor 200.

The pixel electrode 310 may include a conductive material. In an embodiment, the pixel electrode 310 may have a multi-layered structure including a plurality of conductive layers. In an embodiment, for example, the pixel electrode 310 may have a multi-layered structure of Ag/ITO, ITO/Ag/ITO, Mo/ITO, or Al/ITO, but embodiments are not limited thereto.

The auxiliary electrode 400 may be disposed on the third insulating layer 140 to be spaced apart from the pixel electrode 310. The auxiliary electrode 400 may be spaced apart from each of the pixel electrode 310 included in the first sub-pixel SPX1, a pixel electrode 310 included in the second sub-pixel SPX2, and a pixel electrode 310 included in the third sub-pixel SPX3.

Figure 4:
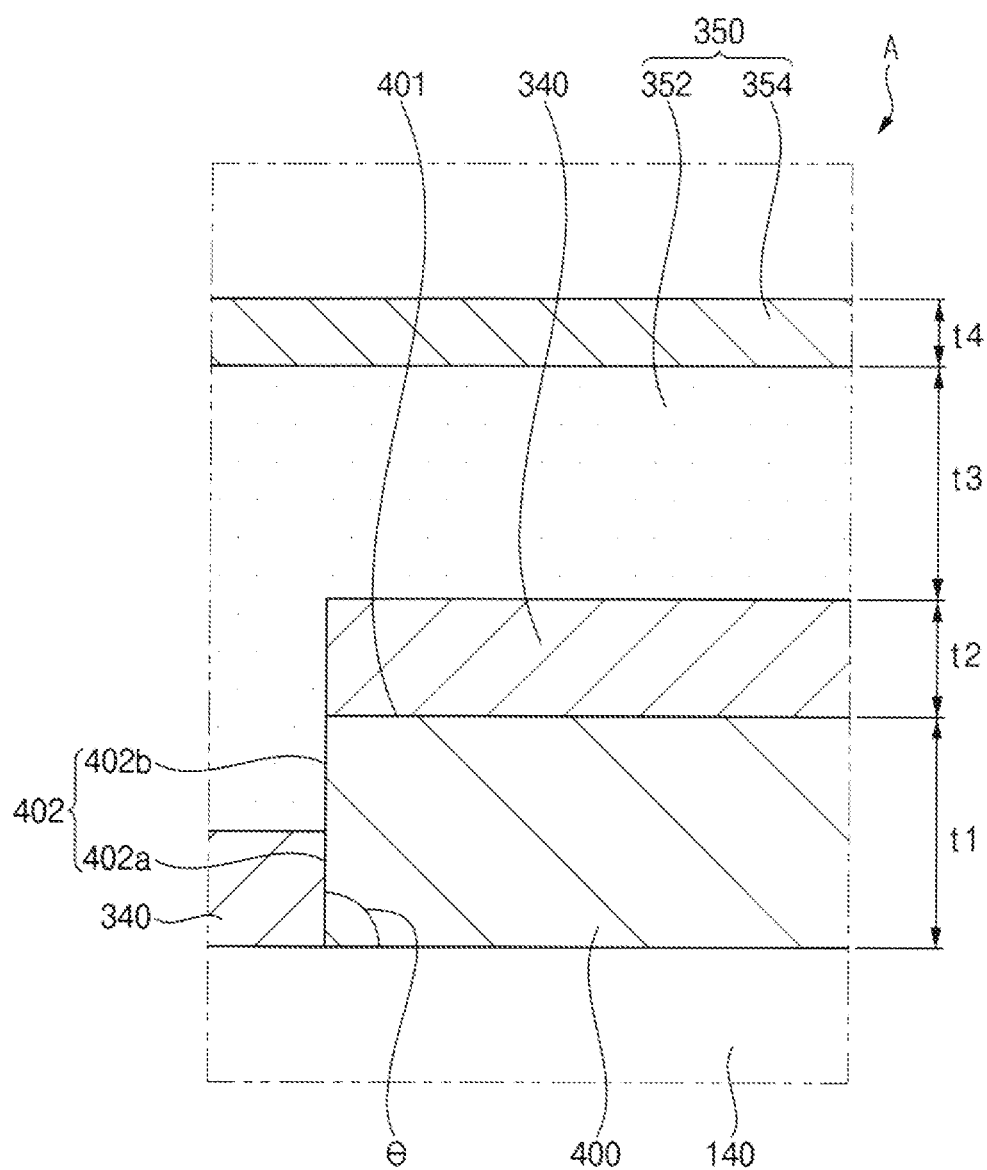
FIG. 4 is an enlarged cross-sectional view of area 'A' of FIG. 3.

The auxiliary electrode 400 may include a conductive material having relatively high electrical conductivity. As illustrated in FIG. 4, the auxiliary electrode 400 may directly contact the common electrode 350. As being in contact, elements may form an interface between the elements, without being limited thereto. Accordingly, the auxiliary electrode 400 may be electrically connected to the common electrode 350 to prevent or reduce an IR drop of a voltage applied to the common electrode 350. This will be described later in detail with reference to FIG. 4.

In an embodiment, the auxiliary electrode 400 may include a material different from the pixel electrode 310. In an embodiment, for example, the auxiliary electrode 400 may include Cu or Mo, but embodiments are not limited thereto.

In an embodiment, the auxiliary electrode 400 may have a multi-layered structure including a conductive layer and an adhesive layer. The adhesive layer may be disposed under and/or on the conductive layer. In an embodiment, for example, the conductive layer may include Cu, and the adhesive layer may include Ti. The adhesive layer within the auxiliary electrode 400 may improve adhesion between the third insulating layer 140 and the conductive layer.

A fourth insulating layer 150 may be disposed on the pixel electrode 310. The fourth insulating layer 150 may define a first opening OP1 and a second opening OP2.

The first opening OP1 may expose a central portion of the pixel electrode 310 to outside the fourth insulating layer 150. That is, the fourth insulating layer 150 may cover a peripheral portion of the pixel electrode 310.

The second opening OP2 may expose the auxiliary electrode 400 to outside the fourth insulating layer 150. A sidewall of the fourth insulating layer 150 may define the first opening OP1 and the second opening OP2. The auxiliary electrode 400 may include side surfaces which oppose each other in the direction along the substrate 110. A width of the second opening OP2 may be greater than a width of the auxiliary electrode 400, in a direction along the substrate 110. That is, as illustrated in FIG. 3, the fourth insulating layer 150 may be spaced apart from each of both side surfaces of the auxiliary electrode 400 which are opposite to each other.

The first functional layer 320 may be disposed on the pixel electrode 310. The first functional layer 320 may be disposed in the first opening OP1 of the fourth insulating layer 150. The first functional layer 320 may not be disposed in the second opening OP2 of the fourth insulating layer 150. That is, the first functional layer 320 may overlap the pixel electrode 310, and may not overlap the auxiliary electrode 400.

The first functional layer 320 may include at least one of a hole injection layer (HIL) and a hole transport layer (HTL). The HIL and the HTL may allow holes injected from the pixel electrode 310 to be easily transported. The HIL may include CuPc or starburst type-amines such as TCTA, m-MTDATA, IDE406, or the like. The HTL may include TPD, α-TPD, or the like.

The emission layer 330 may be disposed on the first functional layer 320. That is, the emission layer 330 may be disposed in the first opening OP1 of the fourth insulating layer 150. The emission layer 330 may not be disposed in the second opening OP2 of the fourth insulating layer 150. The emission layer 330 may overlap the pixel electrode 310, and may not overlap the auxiliary electrode 400. The emission layer 330 may include at least one of an organic light emitting material and quantum dot.

In an embodiment, the organic light emitting material may include a low molecular organic compound or a high molecular organic compound. Examples of the low molecular organic compound may include copper phthalocyanine, N,N'-diphenylbenzidine, tris-(8-hydroxyquinoline)aluminum, or the like. Examples of the high molecular organic compound may include poly(3,4-ethylenedioxythiophene), polyaniline, poly-phenylenevinylene, polyfluorene, or the like. These can be used alone or in a combination thereof.

In an embodiment, the quantum dot may include a core including a Group II-VI compound, a Group III-V compound, a Group IV-VI compound, a Group IV element, and/or a Group IV compound. In an embodiment, the quantum dot may have a core-shell structure including the core and a shell surrounding the core. The shell may serve as a protection layer for preventing the core from being chemically denatured to maintain semiconductor characteristics, and may serve as a charging layer for imparting electrophoretic characteristics to the quantum dot.

The second functional layer 340 may be disposed on each of the pixel electrode 310 and the auxiliary electrode 400. In an embodiment, for example, the second functional layer 340 may be disposed on an entirety of the fourth insulating layer 150, in the first opening OP1 of the fourth insulating layer 150, and in the second opening OP2 of the fourth insulating layer 150. A portion of the second functional layer 340 disposed in the first opening OP1 may overlap the pixel electrode 310. A portion of the second functional layer 340 disposed in the second opening OP2 may overlap the auxiliary electrode 400. The second functional layer 340 may be disconnected at the auxiliary electrode 400, to expose a side surfaced area of the auxiliary electrode 400 to outside the second functional layer 340.

In an embodiment, the second functional layer 340 may be formed by an anisotropic deposition such as a vacuum deposition. Accordingly, the portion of the second functional layer 340 disposed in the second opening OP2 may cover an upper surface 401 of the auxiliary electrode 400 and may expose a portion of a side surface of the auxiliary electrode 400 to outside the second functional layer 340. This will be described later in detail with reference to FIG. 4.

The second functional layer 340 may include at least one of an electron transport layer (ETL) and an electron injection layer (EIL). The EIL and the ETL may allow electrons injected from the common electrode 350 to be easily transported. The ETL may include Alq3, PBD, TNF, BMD, BND, or the like. The EIL may include LiF, NaCl, CsF, Li2O, BaO, or the like.

The common electrode 350 may be disposed on the second functional layer 340. The common electrode 350 may include a first layer 352 and a second layer 354 which is on the first layer 352. That is, the first layer 352 may be closer to the pixel electrode 310 than the second layer 354, along a thickness direction of the display panel 10.

The first layer 352 may be disposed on an entirety of the second functional layer 340. That is, the first layer 352 may be disposed on each of the fourth insulating layer 150, in the first opening OP1 of the fourth insulating layer 150, and the second opening OP2 of the fourth insulating layer 150. A portion of the first layer 352 disposed in the first opening OP1 may overlap the pixel electrode 310. A portion of the first layer 352 disposed in the second opening OP2 may overlap the auxiliary electrode 400.

In an embodiment, the first layer 352 may be formed to have a relatively thick thickness by an isotropic deposition such as a sputtering. Accordingly, the portion of the first layer 352 disposed in the second opening OP2 may directly contact the portion of the side surface 402 of the auxiliary electrode 400 exposed outside of the second functional layer 340. This will be described later in detail with reference to FIG. 4.

The first layer 352 may include a transparent conductive material such as ITO, IZO, or the like. Accordingly, even though the first layer 352 has a relatively thick thickness, light emitted from the emission layer 330 may be transmitted.

The second layer 354 may be disposed on the first layer 352 and further from the substrate 110 than the first layer 352. That is, the second layer 354 may be disposed on an entirety of the fourth insulating layer 150, in the first opening OP1 of the fourth insulating layer 150, and the second opening OP2 of the fourth insulating layer 150. A portion of the second layer 354 disposed in the first opening OP1 may overlap the pixel electrode 310. A portion of the second layer 354 disposed in the second opening OP2 may overlap the auxiliary electrode 400.

In an embodiment, the second layer 354 may be formed by an anisotropic deposition such as a vacuum deposition. In an embodiment, the second layer 354 may be formed by an isotropic deposition such as a sputtering.

The second layer 354 may include a metal or alloy having relatively high electrical conductivity, such as Ag, AgMg, or the like. The second layer 354 may be formed to have a relatively thin thickness to transmit light emitted from the emission layer 330.

FIG. 4 is an enlarged cross-sectional view of area 'A' of FIG. 3.

Hereinafter, the auxiliary electrode 400, the second functional layer 340, and the common electrode 350 will be described in more detail with reference to FIGS. 3 and 4.

Referring to FIGS. 3 and 4, in an embodiment, the portion of the second functional layer 340 disposed in the second opening OP2 may cover an upper surface 401 of the auxiliary electrode 400 and a first portion 402a of the side surface 402 of the auxiliary electrode 400, and may expose a second portion 402b of the side surface 402 of the auxiliary electrode 400 to outside the second functional layer 340. The first layer 352 of the common electrode 350 may directly contact the second portion 402b of the side surface 402 of the auxiliary electrode 400 exposed to outside the second functional layer 340. Accordingly, the auxiliary electrode 400 may be electrically connected to the common electrode 350.

The auxiliary electrode 400 may have a first thickness t1, and the second functional layer 340 may have a second thickness t2. The first thickness t1 may be greater than the second thickness t2. In an embodiment, for example, a difference between the first thickness t1 and the second thickness t2 may be about 500 angstroms (Å) to about 6000 Å.

When the first thickness t1 is less than about 1000 Å, the difference between the first thickness t1 and the second thickness t2 may not be sufficient. Accordingly, the second functional layer 340 may cover all of the side surface 402 of the auxiliary electrode 400, or an area of the second portion 402b of the side surface 402 of the auxiliary electrode 400 exposed by the second functional layer 340 may not be sufficient for electrical connection to the common electrode 350. Accordingly, the auxiliary electrode 400 may not be electrically connected to the common electrode 350. When the first thickness t1 is greater than about 6000 Å, there may be difficulties in a patterning process.

In an embodiment, for example, the first thickness t1 may be about 1000 Å to about 6000 Å, such as about 1500 Å to about 4000 Å or about 2000 Å to about 3000 Å.

When the second thickness t2 is less than about 10 Å, the second functional layer 340 may not sufficiently serve as the EIL and the ETL. When the second thickness t2 is greater than about 500 Å, the difference between the first thickness t1 and the second thickness t2 may not be sufficient. Accordingly, the second functional layer 340 may cover all of the side surface 402 of the auxiliary electrode 400, or an area of the second portion 402b of the side surface 402 of the auxiliary electrode 400 exposed by the second functional layer 340 may not be sufficient for electrical connection to the common electrode 350. Accordingly, the auxiliary electrode 400 may not be electrically connected to the common electrode 350.

In an embodiment, for example, the second thickness t2 may be about 10 Å to about 500 Å, such as about 100 Å to about 400 Å or about 200 Å to about 300 Å.

In an embodiment, a taper angle θ of the auxiliary electrode 400 may be defined as an angle between a lower surface of the auxiliary electrode 400 and the side surface 402 of the auxiliary electrode 400. The lower surface of the auxiliary electrode 400 is furthest from the common electrode 350 while an upper surface of the auxiliary electrode 400 is closest to the common electrode 350. The auxiliary electrode 400 has the lower surface which extends from the side surface 402, to form the taper angle θ.

When the taper angle θ of the auxiliary electrode 400 is less than about 80 degrees, the second functional layer 340 may cover all of the side surface 402 of the auxiliary electrode 400, or an area of the second portion 402b of the side surface 402 of the auxiliary electrode 400 exposed by the second functional layer 340 may not be sufficient for electrical connection with the common electrode 350. Accordingly, the auxiliary electrode 400 may not be electrically connected to the common electrode 350.

In an embodiment, for example, the taper angle θ may be about 80 degrees to about 90 degrees.

In an embodiment, for example, the taper angle θ may be about 90 degrees to about 120 degrees. In this case, the auxiliary electrode 400 may have a reverse tapered shape.

The first layer 352 of the common electrode 350 may have a third thickness t3, and the second layer 354 may have a fourth thickness t4. The third thickness t3 and the fourth thickness t4 may correspond to the auxiliary electrode 400, where a portion of the second functional layer 340 is between both the third thickness t3 and the fourth thickness t4, and the auxiliary electrode 400, respectively. The third thickness t3 may be greater than the fourth thickness t4.

When the third thickness t3 is less than about 500 Å, the first layer 352 may not contact the second portion 402b of the side surface 402 of the auxiliary electrode 400 exposed by the second functional layer 340. Accordingly, the auxiliary electrode 400 may not be electrically connected to the common electrode 350. When the third thickness t3 is greater than about 6000 Å, it may be difficult to adjust a resonance thickness of the light emitting element 300.

In an embodiment, for example, the third thickness t3 may be about 500 Å to about 6000 Å, such as about 1000 Å to about 4000 Å or about 1500 Å to about 2500 Å.

When the fourth thickness t4 is less than about 10 Å, an electrical conductivity of the second layer 354 may be excessively reduced. When the fourth thickness t4 is greater than about 100 Å, light emitted from the emission layer 330 may not be transmitted.

In an embodiment, for example, the fourth thickness t4 may be about 10 Å to about 100 Å.

In embodiments, the auxiliary electrode 400 may be electrically connected to the common electrode 350 to prevent or reduce the IR drop of the voltage applied to the common electrode 350. Accordingly, a display quality of the display panel 10 may be improved. In addition, the auxiliary electrode 400 may be electrically connected to the common electrode 350 without a separate process (e.g., a laser drilling) for partially removing the second functional layer 340. Accordingly, a cost and a time of providing (or manufacturing) the display panel 10 may be reduced.

FIGS. 5 to 14 are cross-sectional views illustrating embodiments of processes in a method of providing (or manufacturing) manufacturing the display panel 10 of FIG. 3.

Figure 5:
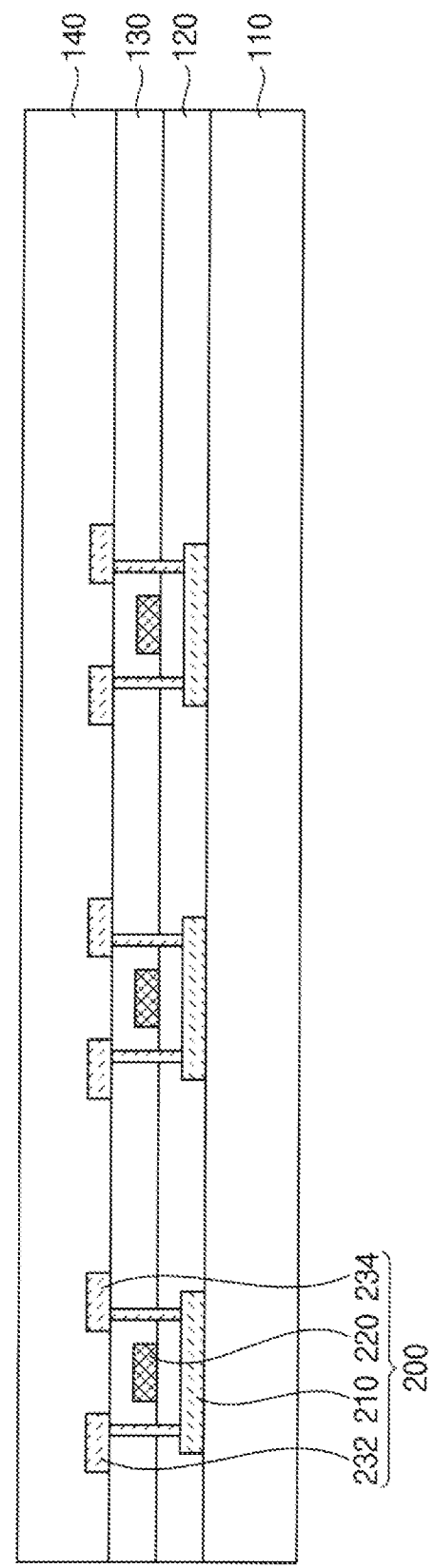
FIGS. 5 to 14 are cross-sectional views illustrating an embodiment of a method of providing (or manufacturing) the display panel of FIG. 3.

Referring to FIG. 5, the thin film transistor 200 may be provided (or formed) on the substrate 110.

The active layer 210 may be formed on the substrate 110. The active layer 210 may be formed using an oxide semiconductor, a silicon semiconductor, an organic semiconductor, or the like.

The first insulating layer 120 may be formed on the substrate 110. The first insulating layer 120 may cover the active layer 210 on the substrate 110. The first insulating layer 120 may be formed using an inorganic insulating material.

The gate electrode 220 may be formed on the first insulating layer 120. The gate electrode 220 may be formed using a conductive material.

The second insulating layer 130 may be formed on the first insulating layer 120. The second insulating layer 130 may cover the gate electrode 220 on the first insulating layer 120. The second insulating layer 130 may be formed using an inorganic insulating material.

Contact holes may be formed in the first insulating layer 120 and the second insulating layer 130 to respectively overlap the source area and the drain area of the active layer 210. In addition, the source electrode 232 and the drain electrode 234 may be formed on the second insulating layer 130 to respectively overlap and extend into the contact holes. Each of the source electrode 232 and the drain electrode 234 may be formed using a conductive material. The source electrode 232 and the drain electrode 234 may be connected to the source area and the drain area of the active layer 210 through the contact holes, respectively. Accordingly, the thin film transistor 200 including the active layer 210, the gate electrode 220, the source electrode 232, and the drain electrode 234 may be formed on the substrate 110.

The third insulating layer 140 covering the thin film transistor 200 may be formed on the second insulating layer 130. The third insulating layer 140 may cover the source electrode 232 and the drain electrode 234 on the second insulating layer 130. The third insulating layer 140 may be formed using an organic insulating material.

Figure 6:
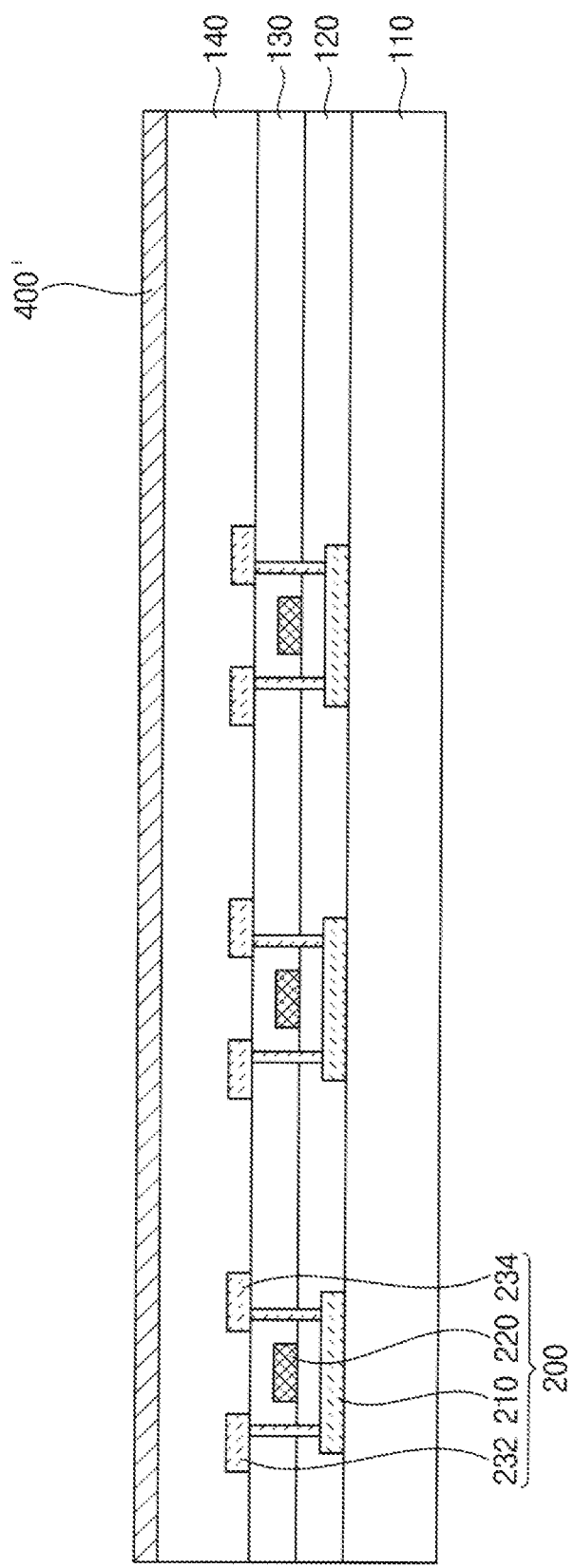
Figure 7:
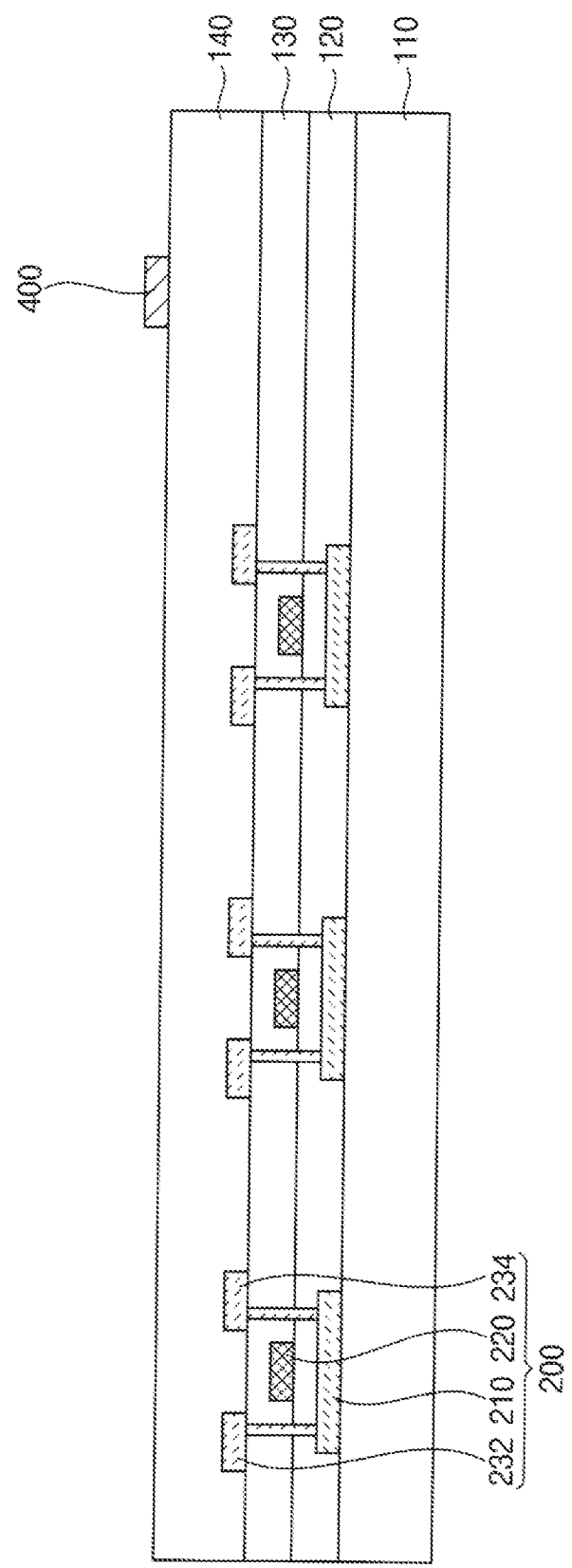

Referring to FIGS. 6 and 7, a first conductive layer 400' may be formed on the third insulating layer 140. The auxiliary electrode 400 may be formed by partially removing the first conductive layer 400' through a photolithography process and a first etching process. That is, the auxiliary electrode 400 may be a pattern of the first conductive layer 400'.

The first conductive layer 400' may be formed using a first material. The first material may include a conductive material having relatively high electrical conductivity. In an embodiment, for example, the first material may include Cu or Mo, but embodiments are not limited thereto.

In an embodiment, for example, a thickness of the first conductive layer 400' may be about 1000 Å to about 6000 Å, such as about 1500 Å to about 4000 Å or about 2000 Å to about 3000 Å.

The first etching process may be a dry etching process or a wet etching process. In an embodiment, for example, in order for the auxiliary electrode 400 to have a relatively large taper angle θ, etching conditions of the first etching process may be appropriately adjusted.

Figure 8:
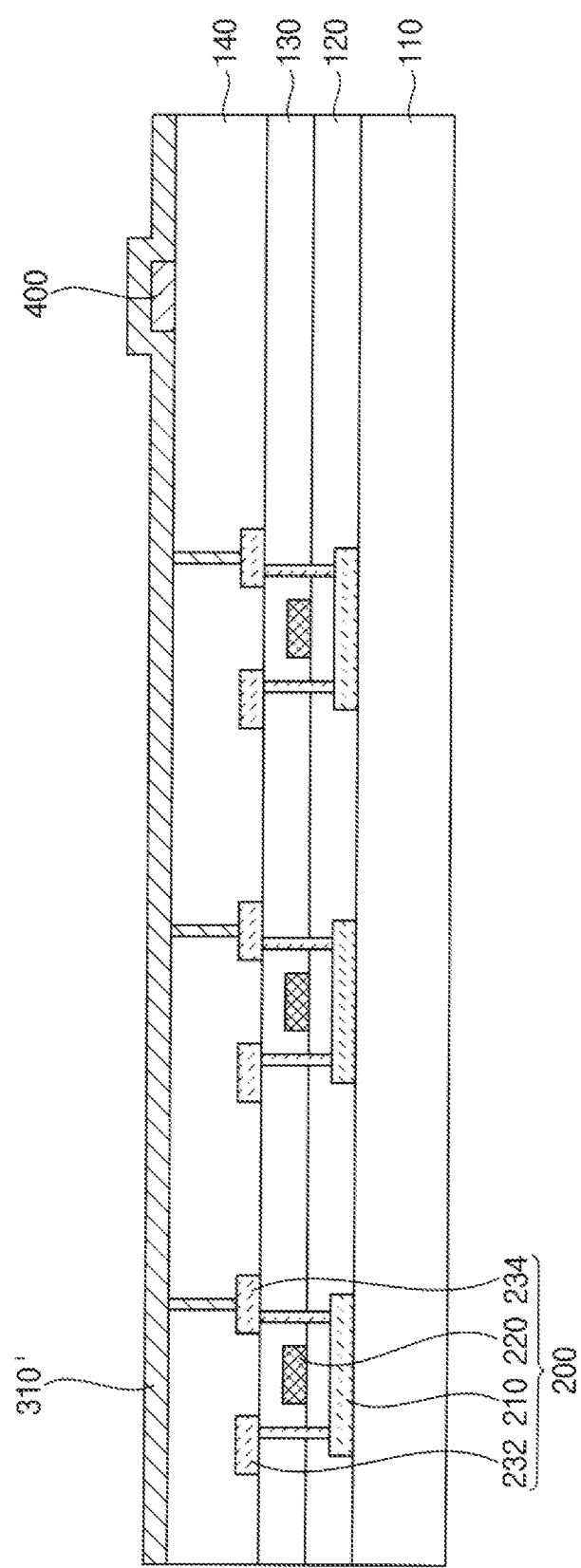
Figure 9:
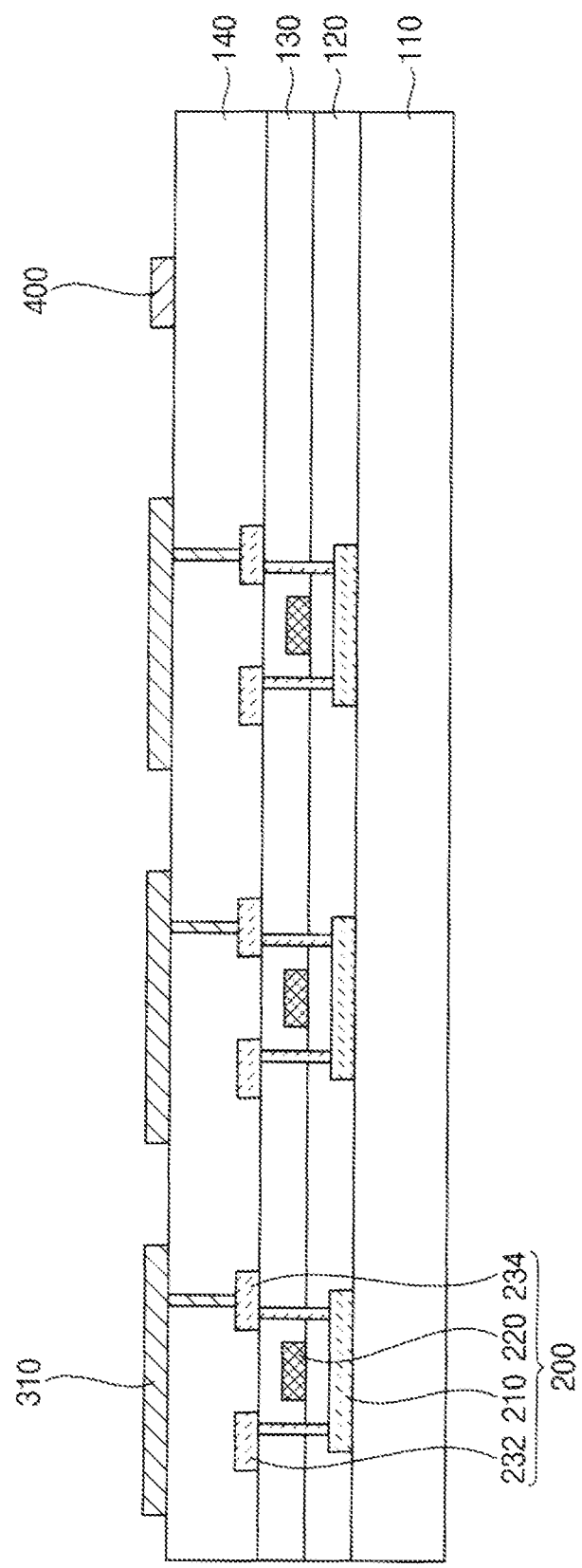

Referring to FIGS. 8 and 9, a contact hole may be formed in the third insulating layer 140 to overlap (or correspond to) the drain electrode 234. A second conductive layer 310' may be formed on the third insulating layer 140, and the pixel electrode 310 may be formed by partially removing the second conductive layer 310' through a photolithography process and a second etching process. That is, the pixel electrode 310 is a pattern of the second conductive layer 310'.

The second conductive layer 310' may cover the auxiliary electrode 400 on the third insulating layer 140. The second conductive layer 310' may be formed using a second material different from the first material.

The second etching process may be a wet etching process. In the second etching process, an etchant having a high etching selectivity difference with the first and second materials may be used. In the etchant, an etching selectivity with the first material may be greater than an etching selectivity with the second material. For example, an etching selectivity with the second material in the etchant may be very low.

The second conductive layer 310' may have a first etching rate for the second etching process. The auxiliary electrode 400 may have a second etching rate lower than the first etching rate for the second etching process. In an embodiment, for example, the auxiliary electrode 400 may be hardly removed by the second etching process.

In an embodiment, the second conductive layer 310' may have a multi-layered structure including a plurality of conductive layers. In this case, all of materials included in the plurality of conductive layers may be different from the first material. In an embodiment, for example, the second conductive layer 310' may have a multi-layered structure of Ag/ITO, ITO/Ag/ITO, Mo/ITO, or Al/ITO, but embodiments are not limited thereto.

The pixel electrode 310 may be connected to the drain electrode 234 through the contact hole formed in the third insulating layer 140. The pixel electrode 310 may be spaced apart from the auxiliary electrode 400 in a direction along the insulating layer (e.g., third insulating layer 140).

Figure 10:
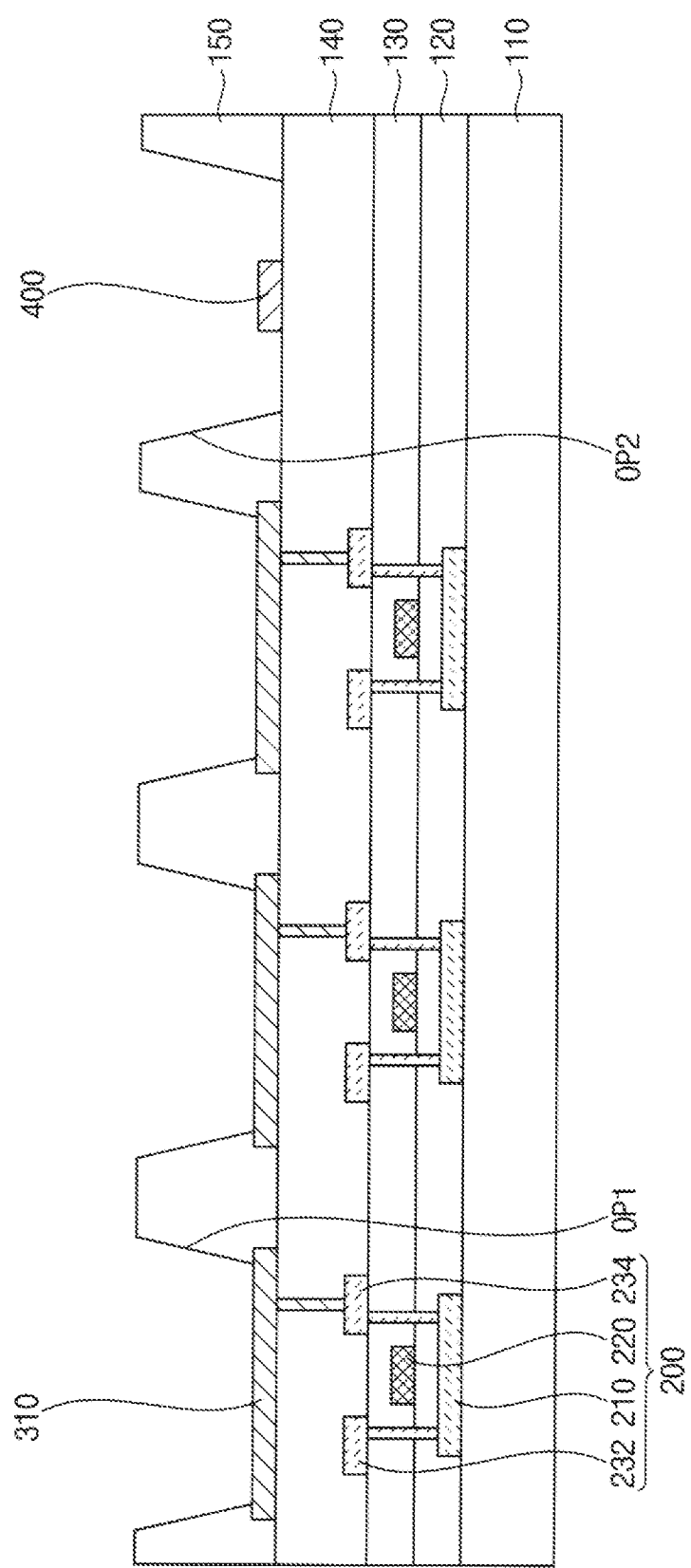

Referring to FIG. 10, the fourth insulating layer 150 may be formed on the third insulating layer 140. The first opening OP1 exposing the central portion of the pixel electrode 310 and the second opening OP2 exposing the auxiliary electrode 400 may be formed in the fourth insulating layer 150. The second opening OP2 may be formed to have a width greater than that of the auxiliary electrode 400, such as in the direction along the insulating layer. That is, the second opening OP2 may expose the upper surface and both side surfaces of the auxiliary electrode 400, to outside the fourth insulating layer 150. A sidewall of the fourth insulating layer 150 which defines the second opening OP2 may be spaced apart from both of opposing side surfaces of the auxiliary electrode 400.

Figure 11:
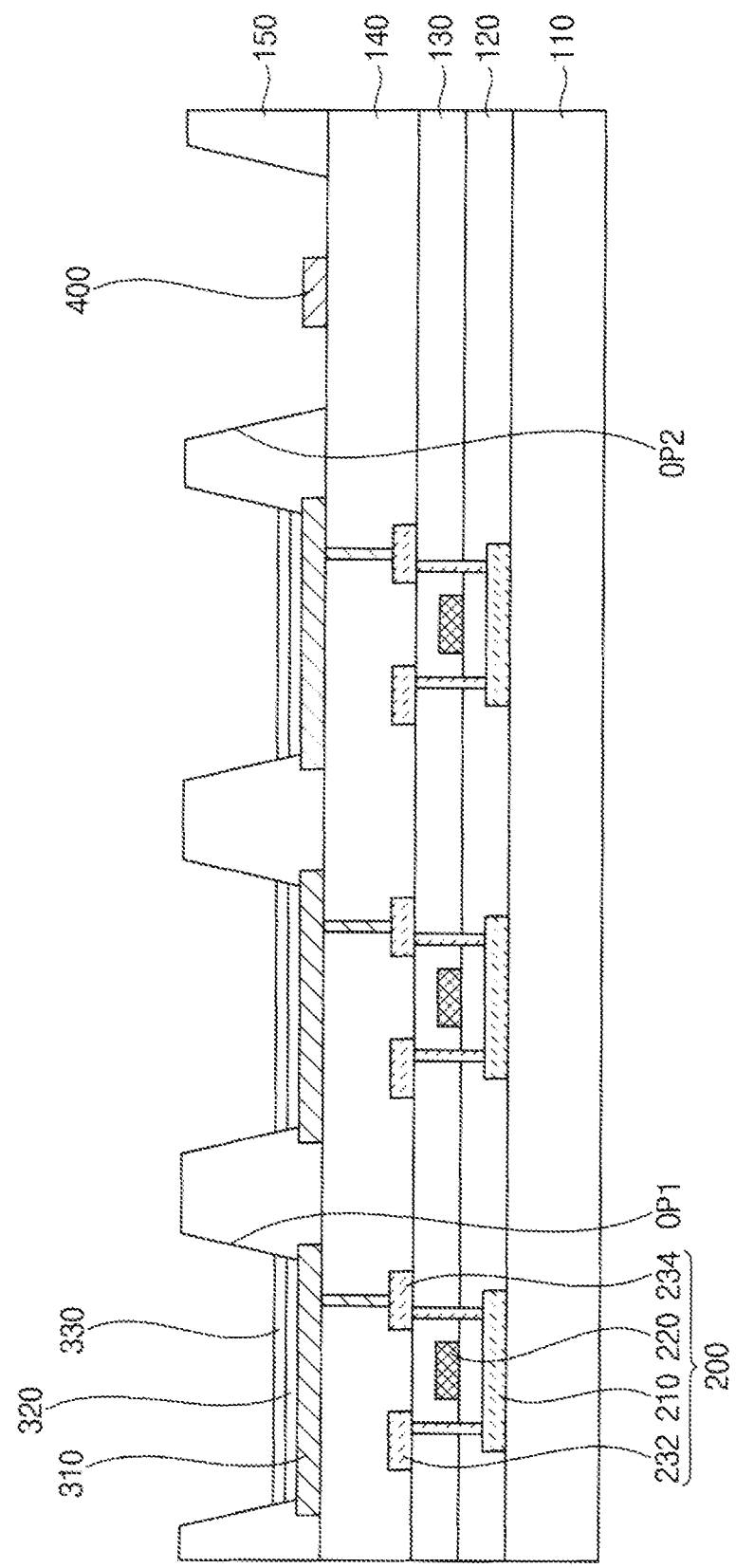

Referring to FIG. 11, the first functional layer 320 may be formed on the pixel electrode 310. The first functional layer 320 may be formed in the first opening OP1 of the fourth insulating layer 150. The first functional layer 320 may not be formed in the second opening OP2 of the fourth insulating layer 150. In an embodiment, for example, the first functional layer 320 may be selectively formed in the first opening OP1 by an inkjet printing. The first functional layer 320 may include patterns which are disconnected from each other along the insulating layer and spaced apart from the second opening OP2 (e.g., not formed in the second opening OP2).

The emission layer 330 may be formed on the first functional layer 320. The emission layer 330 may be formed in the first opening OP1 of the fourth insulating layer 150. The emission layer 330 may not be formed in the second opening OP2 of the fourth insulating layer 150. In an embodiment, for example, the emission layer 330 may be selectively formed in the first opening OP1 by an inkjet printing. The emission layer 330 may include patterns which are disconnected from each other along the insulating layer and spaced apart from the second opening OP2 (e.g., not formed in the second opening OP2).

Figure 12:
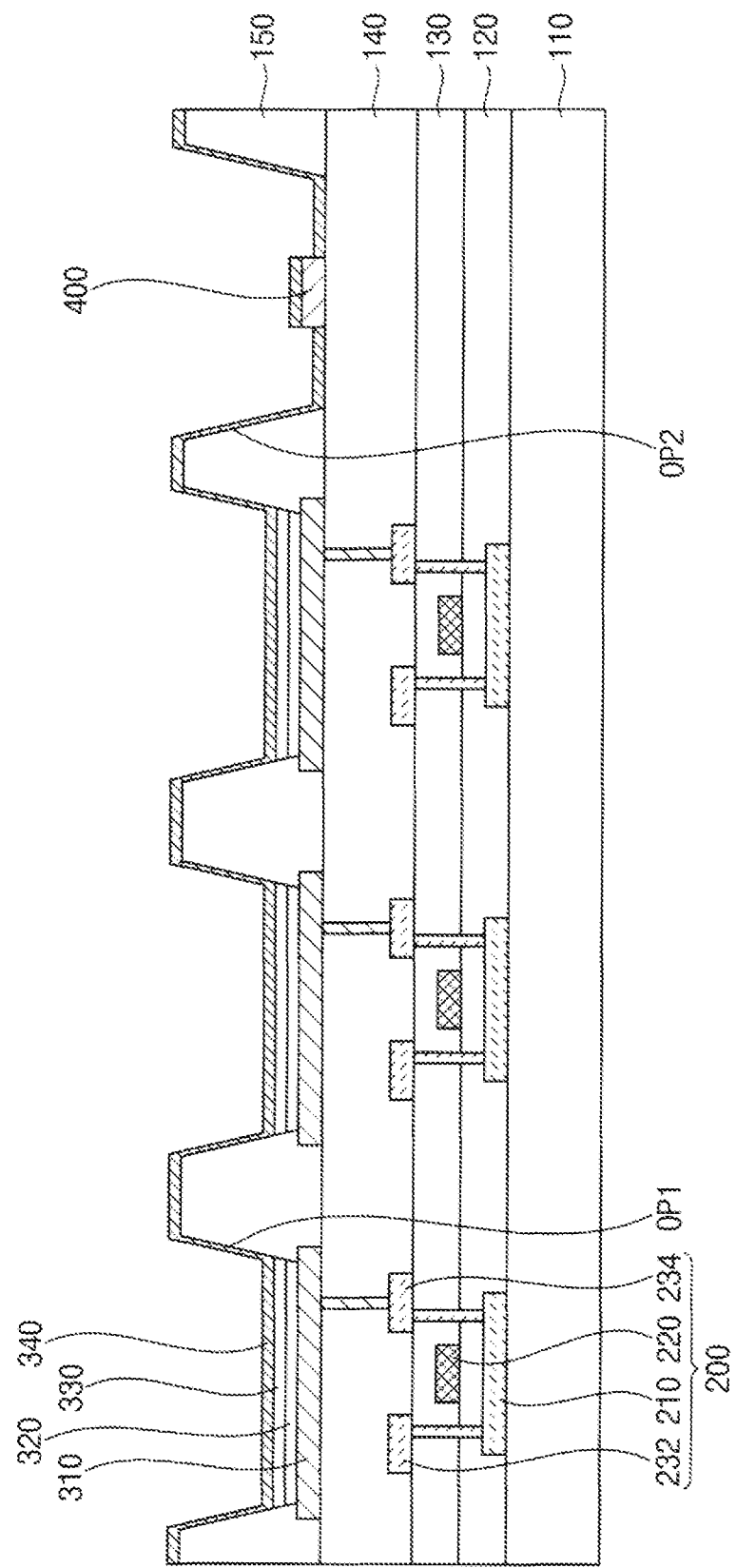

Referring to FIG. 12, the second functional layer 340 may be formed on the pixel electrode 310 and the auxiliary electrode 400. In an embodiment, for example, the second functional layer 340 may be formed on an entirety of the fourth insulating layer 150, in the first opening OP1 of the fourth insulating layer 150, and in the second opening OP2 of the fourth insulating layer 150. A portion of the second functional layer 340 formed in the first opening OP1 may overlap the pixel electrode 310. A portion of the second functional layer 340 formed in the second opening OP2 may overlap the auxiliary electrode 400.

The second functional layer 340 may be formed by an anisotropic deposition such as a vacuum deposition. At the second opening OP2, the second functional layer 340 may include patterns which are disconnected from each other along the thickness direction.

A second thickness t2 of the second functional layer 340 which extends along the upper surface 401 of the auxiliary electrode 400 may be less than a first thickness t1 of the auxiliary electrode 400. In an embodiment, for example, the second thickness t2 may be about 10 Å to about 500 Å, such as about 100 Å to about 400 Å or about 200 Å to about 300 Å. In an embodiment, for example, a difference between the first thickness t1 and the second thickness t2 may be about 500 Å to about 6000 Å.

As the second functional layer 340 having a thickness less than that of the auxiliary electrode 400 is formed by an anisotropic deposition, the portion of the second functional layer 340 formed in the second opening OP2 may cover the upper surface 401 of the auxiliary electrode 400, and may expose a portion of the side surface 402 of the auxiliary electrode 400 to outside the second functional layer 340.

Figure 13:
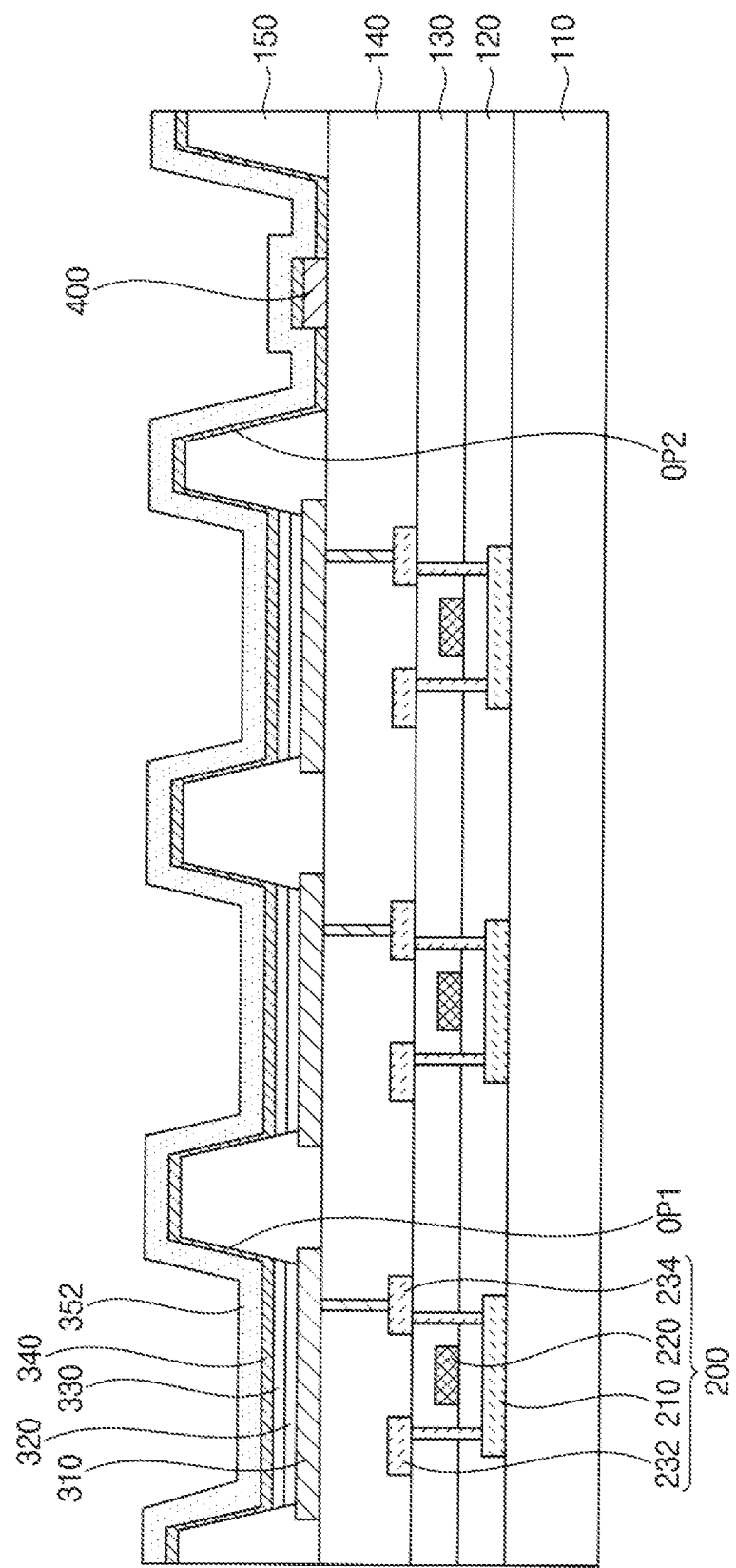
Figure 14:
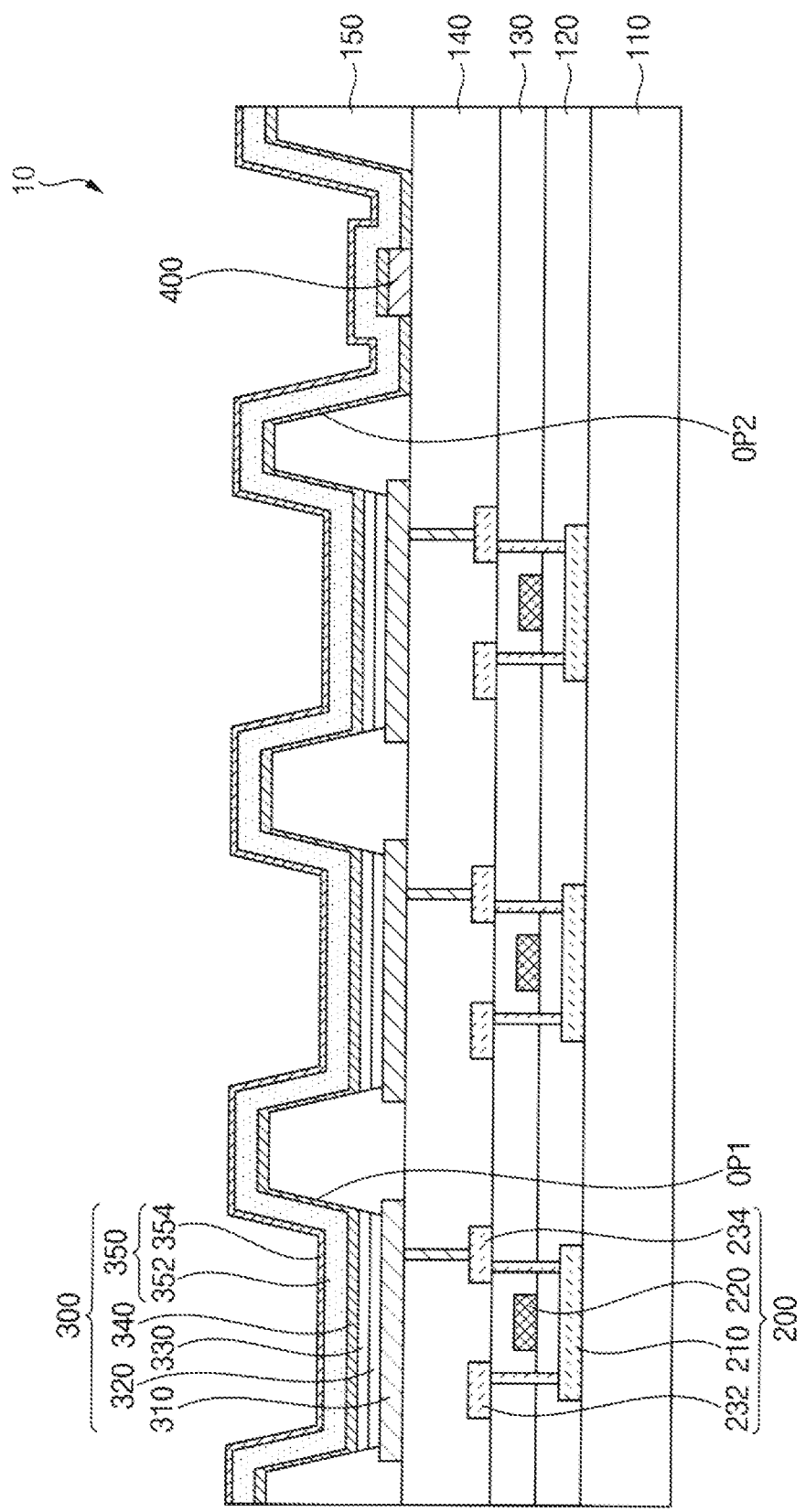

Referring to FIGS. 13 and 14, the common electrode 350 may be formed on the second functional layer 340.

Referring to FIG. 13, the first layer 352 may be formed on the second functional layer 340. The first layer 352 may be formed on an entirety of the second functional layer 340. That is, the first layer 352 may be formed on an entirety of the fourth insulating layer 150, in the first opening OP1 of the fourth insulating layer 150, and in the second opening OP2 of the fourth insulating layer 150. A portion of the first layer 352 formed in the first opening OP1 may overlap the pixel electrode 310. A portion of the first layer 352 formed in the second opening OP2 may overlap the auxiliary electrode 400.

The first layer 352 may be formed by an isotropic deposition such as a sputtering.

In an embodiment, for example, a third thickness t3 of the first layer 352 may be about 500 Å to about 6000 Å, such as about 1000 Å to about 4000 Å or about 1500 Å to about 2500 Å.

As the first layer 352 having a sufficient thickness is formed by an isotropic deposition, the first layer 352 may directly contact the portion of the side surface 402 of the auxiliary electrode 400 which is exposed outside of the second functional layer 340. Accordingly, the auxiliary electrode 400 may be electrically connected to the first layer 352 of the common electrode 350, at the second opening OP2.

Referring to FIG. 14, the second layer 354 may be formed on the first layer 352. That is, the second layer 354 may be formed on an entirety of the fourth insulating layer 150, in the first opening OP1 of the fourth insulating layer 150, and in the second opening OP2 of the fourth insulating layer 150. A portion of the second layer 354 formed in the first opening OP1 may overlap the pixel electrode 310. A portion of the second layer 354 formed in the second opening OP2 may overlap the auxiliary electrode 400.

In an embodiment, the second layer 354 may be formed by an anisotropic deposition such as a vacuum deposition. In an embodiment, the second layer 354 may be formed by an isotropic deposition such as a sputtering.

The second layer 354 may be formed using a metal or alloy having relatively high electrical conductivity, such as Ag, AgMg, or the like. The second layer 354 may be formed to have a relatively thin thickness to transmit light emitted from the emission layer 330. In an embodiment, for example, a fourth thickness t4 of the second layer 354 may be about 10 Å to about 100 Å.

In embodiments, the auxiliary electrode 400 may be electrically connected to the common electrode 350 to prevent or reduce the IR drop of the voltage applied to the common electrode 350. Accordingly, a display quality of the display panel 10 may be improved. In addition, the auxiliary electrode 400 may be electrically connected to the common electrode 350 without a separate process (e.g., a laser drilling) for partially removing the second functional layer 340. Accordingly, a cost and a time of providing (or manufacturing) the display panel 10 may be reduced.

Figure 15:
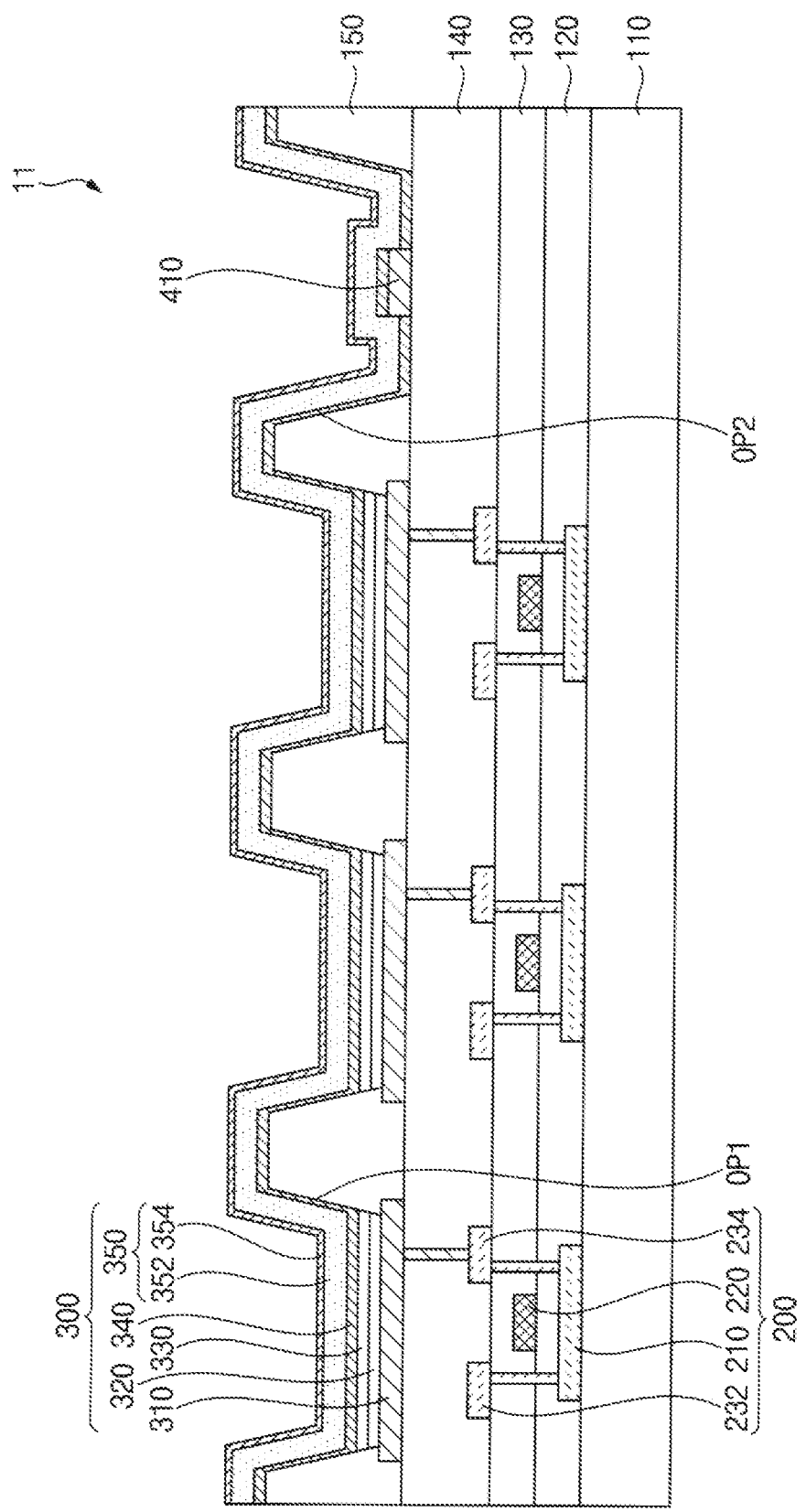
FIG. 15 is a cross-sectional view illustrating an embodiment of a display panel.

FIG. 15 is a cross-sectional view illustrating an embodiment of a display panel 11. In an embodiment, for example, a display panel 11 described with reference to FIG. 15 may be substantially same as or similar to the display panel 10 described with reference to FIGS. 3 and 4 except for an auxiliary electrode 410. Therefore, repeated descriptions will be omitted or simplified.

Referring to FIG. 15, the display panel 11 may include a substrate 110, the first sub-pixel SPX1, the second sub-pixel SPX2, the third sub-pixel SPX3, and an auxiliary electrode 410. The first sub-pixel SPX1 may include the thin film transistor 200 and the light emitting element 300. The thin film transistor 200 may include an active layer 210, a gate electrode 220, a source electrode 232, and a drain electrode 234. The light emitting element 300 may include a pixel electrode 310, a first functional layer 320, an emission layer 330, a second functional layer 340, and a common electrode 350. Each of the second sub-pixel SPX2 and the third sub-pixel SPX3 may have a structure substantially the same as or similar to that of the first sub-pixel SPX1.

The pixel electrode 310 may include a conductive material. In an embodiment, the pixel electrode 310 may have a multi-layered structure including a plurality of conductive layers. For example, the pixel electrode 310 may have a multi-layered structure of Ag/ITO, ITO/Ag/ITO, Mo/ITO, or Al/ITO, but embodiments are not limited thereto.

The auxiliary electrode 410 may be disposed on the third insulating layer 140 to be spaced apart from the pixel electrode 310. The auxiliary electrode 410 may be spaced apart from each of the pixel electrode 310 included in the first sub-pixel SPX1, a pixel electrode 310 included in the second sub-pixel SPX2, and a pixel electrode 310 included in the third sub-pixel SPX3.

In an embodiment, the auxiliary electrode 410 may include a same material as the pixel electrode 310. The auxiliary electrode 410 may be disposed in a same layer as the pixel electrode 310, and may be substantially simultaneously (or concurrently) formed with the pixel electrode 310. That is, the auxiliary electrode 410 and the pixel electrode 310 may be respective patterns of a same material 1 layer. In an embodiment, for example, the auxiliary electrode 410 may have a multi-layered structure of Ag/ITO, ITO/Ag/ITO, Mo/ITO, or Al/ITO, but embodiments are not limited thereto.

The second functional layer 340 may be disposed on each of the pixel electrode 310 and the auxiliary electrode 410. In an embodiment, the second functional layer 340 may be formed by an anisotropic deposition such as a vacuum deposition. Accordingly, a portion of the second functional layer 340 disposed in the second opening OP2 may cover an upper surface 401 of the auxiliary electrode 410 and may expose a portion of a side surface 402 of the auxiliary electrode 410.

The auxiliary electrode 410 may have a first thickness t1, and the second functional layer 340 may have a second thickness t2. The first thickness t1 may be greater than the second thickness t2. In an embodiment, for example, a difference between the first thickness t1 and the second thickness t2 may be about 500 Å to about 6000 Å.

When the first thickness t1 is less than about 1000 Å, the difference between the first thickness t1 and the second thickness t2 may not be sufficient. Accordingly, the second functional layer 340 may cover all of the side surface 402 of the auxiliary electrode 410, or an area of the portion of the side surface 402 of the auxiliary electrode 410 exposed to outside the second functional layer 340 may not be sufficient. Accordingly, the auxiliary electrode 410 may not be electrically connected to the common electrode 350. When the first thickness t1 is greater than about 6000 Å, there may be difficulties in a patterning process.

In an embodiment, for example, the first thickness t1 may be about 1000 Å to about 6000 Å, such as about 1500 Å to about 4000 Å or about 2000 Å to about 3000 Å.

when the second thickness t2 is less than about 10 Å, the second functional layer 340 may not sufficiently serve as the EIL and the ETL. When the second thickness t2 is greater than about 500 Å, the difference between the first thickness t1 and the second thickness t2 may not be sufficient. Accordingly, the second functional layer 340 may cover all of the side surface 402 of the auxiliary electrode 410, or an area of the portion of the side surface 402 of the auxiliary electrode 410 exposed by the second functional layer 340 may not be sufficient. Accordingly, the auxiliary electrode 410 may not be electrically connected to the common electrode 350.

In an embodiment, for example, the second thickness t2 may be about 10 Å to about 500 Å, such as about 100 Å to about 400 Å or about 200 Å to about 300 Å.

In an embodiment, a taper angle θ of the auxiliary electrode 410 may be defined as an angle between a lower surface of the auxiliary electrode 410 and the side surface 402 of the auxiliary electrode 410.

When the taper angle θ of the auxiliary electrode 410 is less than about 80 degrees, the second functional layer 340 may cover all of the side surface 402 of the auxiliary electrode 410, or an area of the portion of the side surface 402 of the auxiliary electrode 410 exposed to outside the second functional layer 340 may not be sufficient. Accordingly, the auxiliary electrode 410 may not be electrically connected to the common electrode 350.

In an embodiment, for example, the taper angle θ may be about 80 degrees to about 90 degrees.

In an embodiment, for example, the taper angle θ may be about 90 degrees to about 120 degrees. In this case, the auxiliary electrode 410 may have a reverse tapered shape.

The common electrode 350 may be disposed on the second functional layer 340. The common electrode 350 may include a first layer 352 and a second layer 354 which is on the first layer 352.

The first layer 352 may be disposed on an entirety of the second functional layer 340. In an embodiment, the first layer 352 may be formed to have a relatively thick thickness by an isotropic deposition such as a sputtering. Accordingly, a portion of the first layer 352 disposed in the second opening OP2 may directly contact the portion of the side surface 402 of the auxiliary electrode 410 exposed to outside the second functional layer 340. Accordingly, the auxiliary electrode 410 may be electrically connected to the common electrode 350 to prevent or reduce the IR drop of the voltage applied to the common electrode 350.

The first layer 352 of the common electrode 350 may have a third thickness t3, and the second layer 354 of the common electrode 350 may have a fourth thickness t4. The third thickness t3 may be greater than the fourth thickness t4.

When the third thickness t3 is less than about 500 Å, the first layer 352 may not contact the portion of the side surface 402 of the auxiliary electrode 410 exposed to outside the second functional layer 340. Accordingly, the auxiliary electrode 410 may not be electrically connected to the common electrode 350. When the third thickness t3 is greater than about 6000 Å, it may be difficult to adjust the resonance thickness of the light emitting element 300.

In an embodiment, for example, the third thickness t3 may be about 500 Å to about 6000 Å, such as about 1000 Å to about 4000 Å or about 1500 Å to about 2500 Å.

When the fourth thickness t4 is less than about 10 Å, an electrical conductivity of the second layer 354 may be excessively reduced. When the fourth thickness t4 is greater than about 100 Å, light emitted from the emission layer 330 may not be transmitted.

In an embodiment, for example, the fourth thickness t4 may be about 10 Å to about 100 Å.

In some embodiments, the auxiliary electrode 410 may be electrically connected to the common electrode 350 to prevent or reduce the IR drop of the voltage applied to the common electrode 350. Accordingly, a display quality of the display panel 11 may be improved. The auxiliary electrode 410 may be substantially simultaneously (or concurrently) formed with the pixel electrode 310. In addition, the auxiliary electrode 410 may be electrically connected to the common electrode 350 without a separate process (e.g., a laser drilling) for partially removing the second functional layer 340. Accordingly, a cost and a time of providing (or manufacturing) the display panel 11 may be reduced.

FIGS. 16 to 19 are cross-sectional views illustrating an embodiment of a method of providing (or manufacturing) the display panel 11 of FIG. 15.

Figure 16:
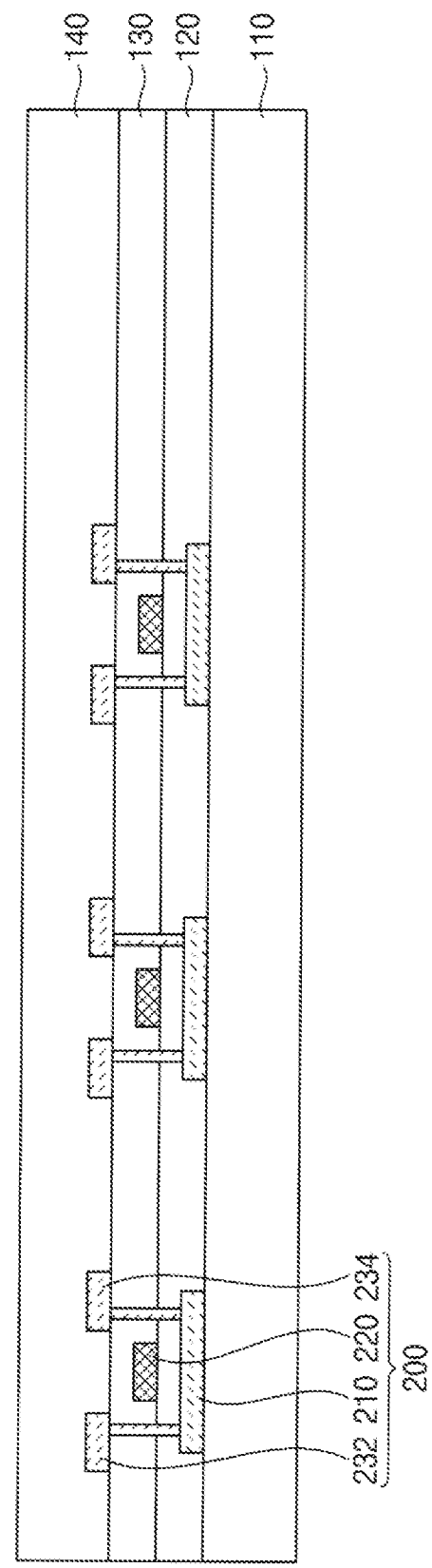
FIGS. 16 to 19 are cross-sectional views illustrating an embodiment of a method of providing (or manufacturing) the display panel of FIG. 15.

Referring to FIG. 16, the thin film transistor 200, the first insulating layer 120, the second insulating layer 130, and the third insulating layer 140 may be formed on the substrate 110. The thin film transistor 200, the first insulating layer 120, the second insulating layer 130, and the third insulating layer 140 may be formed by a method described with reference to FIG. 5. Therefore, repeated descriptions will be omitted.

Figure 17:
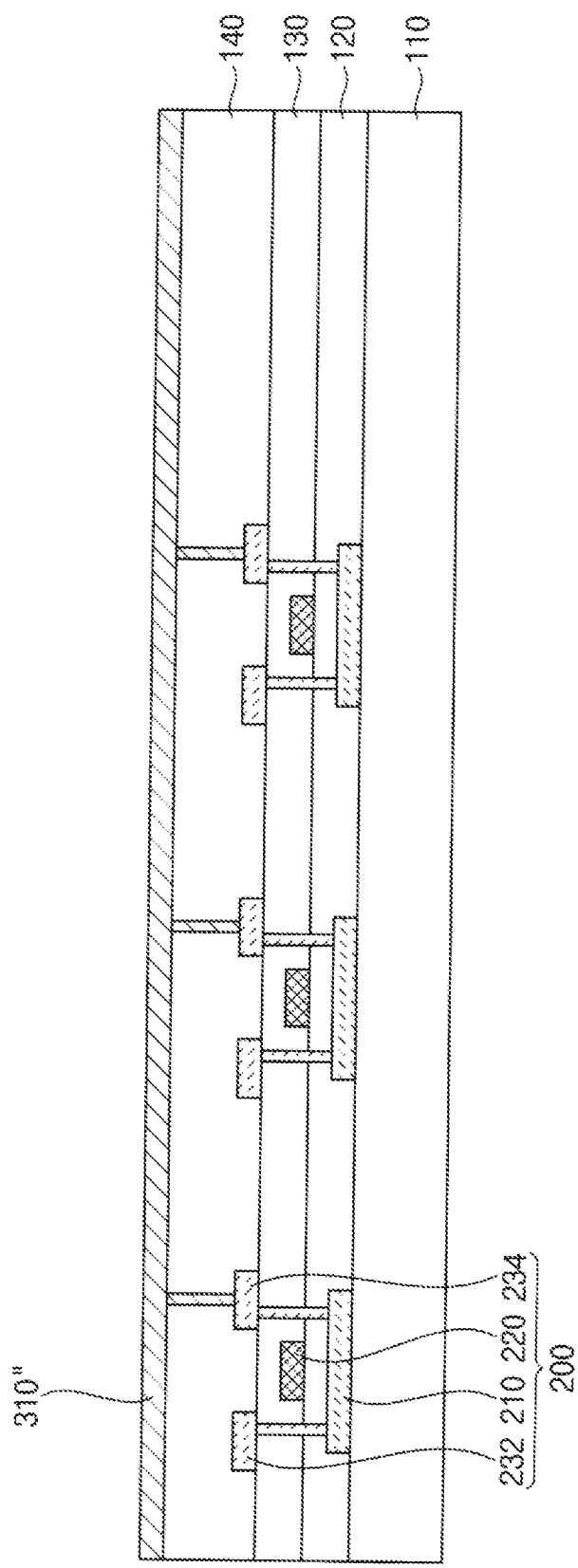
Figure 18:
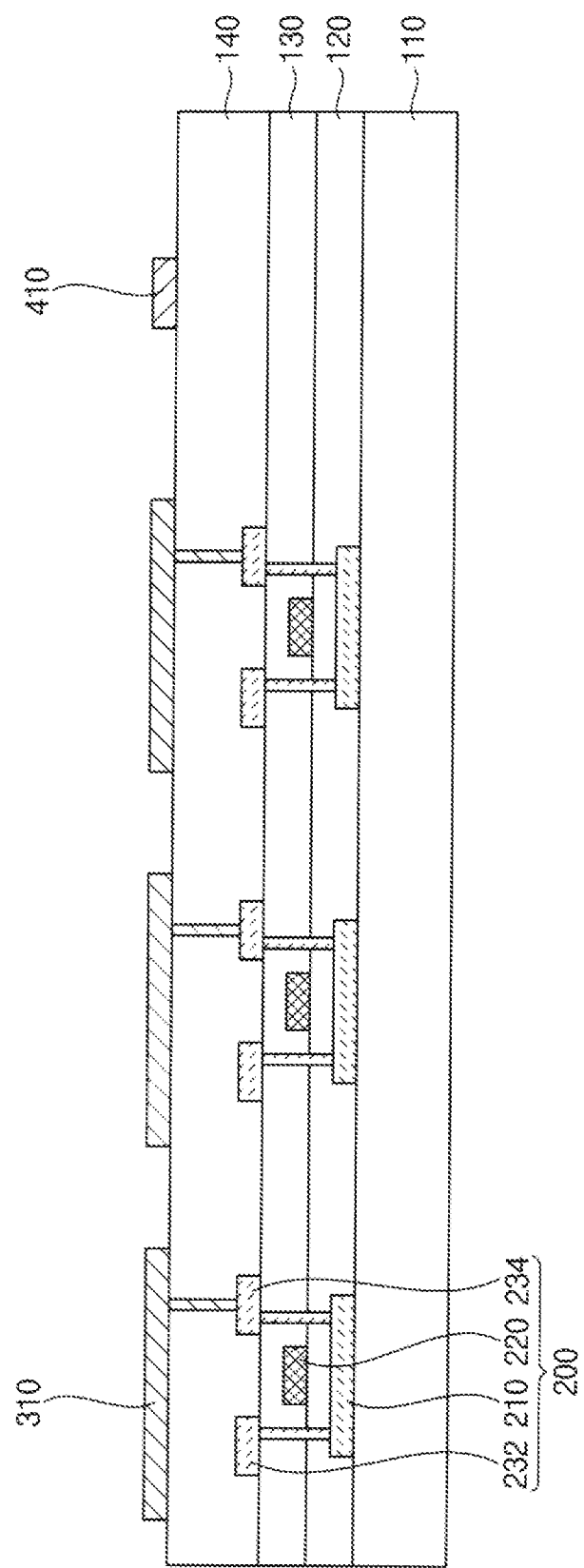

Referring to FIGS. 17 and 18, a contact hole may be formed in the third insulating layer 140 to overlap the drain electrode 234. A conductive layer 310" may be formed on the third insulating layer 140. The pixel electrode 310 and the auxiliary electrode 410 may be formed by partially removing the conductive layer 310" through a photolithography process and an etching process.

In an embodiment, the conductive layer 310" may have a multi-layered structure including a plurality of conductive layers. In an embodiment, for example, the conductive layer 310" may have a multi-layered structure of Ag/ITO, ITO/Ag/ITO, Mo/ITO, or Al/ITO, but embodiments are not limited thereto.

In an embodiment, for example, a thickness of the conductive layer 310" may be about 1000 Å to about 6000 Å, such as about 1500 Å to about 4000 Å or be about 2000 Å to about 3000 Å.

The etching process may be a wet etching process. In an embodiment, for example, in order for the auxiliary electrode 410 to have a relatively large taper angle θ, etching conditions of the etching process may be appropriately adjusted.

The pixel electrode 310 may be connected to the drain electrode 234 through the contact hole formed in the third insulating layer 140. The pixel electrode 310 may be spaced apart from the auxiliary electrode 410.

Figure 19:
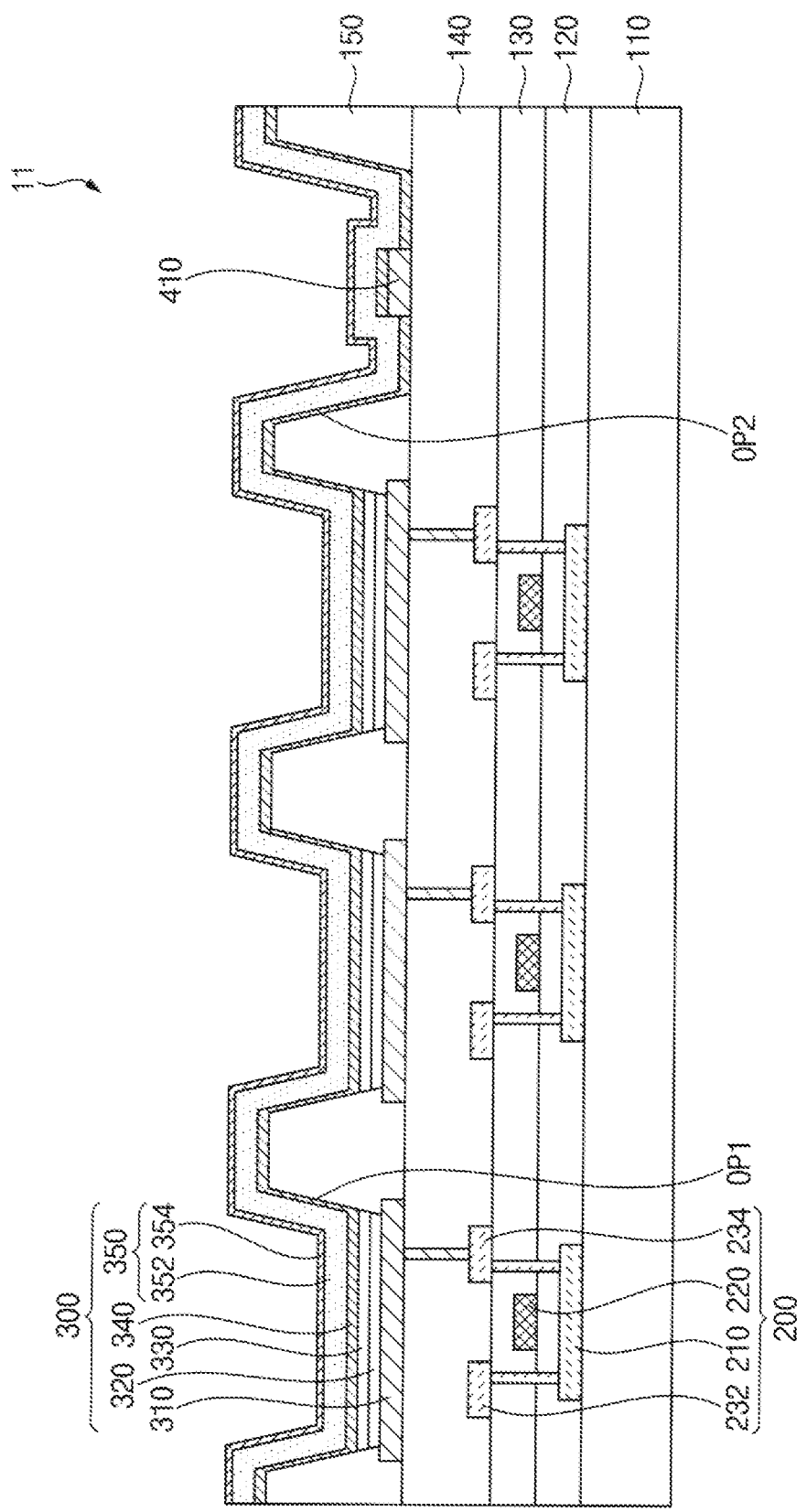

Referring to FIG. 19, the fourth insulating layer 150, the first functional layer 320, the emission layer 330, the second functional layer 340, and the common electrode 350 may be formed on the third insulating layer 140. The fourth insulating layer 150, the first functional layer 320, the emission layer 330, the second functional layer 340, and the common electrode 350 may be formed by a method described with reference to FIGS. 10 to 14. Therefore, repeated descriptions will be omitted.

In embodiments, the auxiliary electrode 410 may be electrically connected to the common electrode 350 to prevent or reduce the IR drop of the voltage applied to the common electrode 350. Accordingly, a display quality of the display panel 11 may be improved. The auxiliary electrode 410 may be substantially simultaneously (or concurrently) formed with the pixel electrode 310, such as to be in a same layer as each other and be respective patterns of a same material layer. In addition, the auxiliary electrode 410 may be electrically connected to the common electrode 350 without a separate process (e.g., a laser drilling) for partially removing the second functional layer 340. Accordingly, a cost and a time of providing (or manufacturing) the display panel 11 may be reduced.

Hereinafter, embodiments will be described in further detail with reference to experimental examples.

EXPERIMENTAL EXAMPLE 1

A conductive layer (thickness of about 1500 Å) having a multi-layered structure of ITO/Ag/ITO was formed on a base substrate.

An organic layer (thickness of about 300 Å) including LiQ was formed on the base substrate by a vacuum deposition, such that a portion of the organic layer overlapped the conductive layer.

Platinum sputtering was performed on the conductive layer and the organic layer for pretreatment, and TEM analysis was performed.

Figure 20:
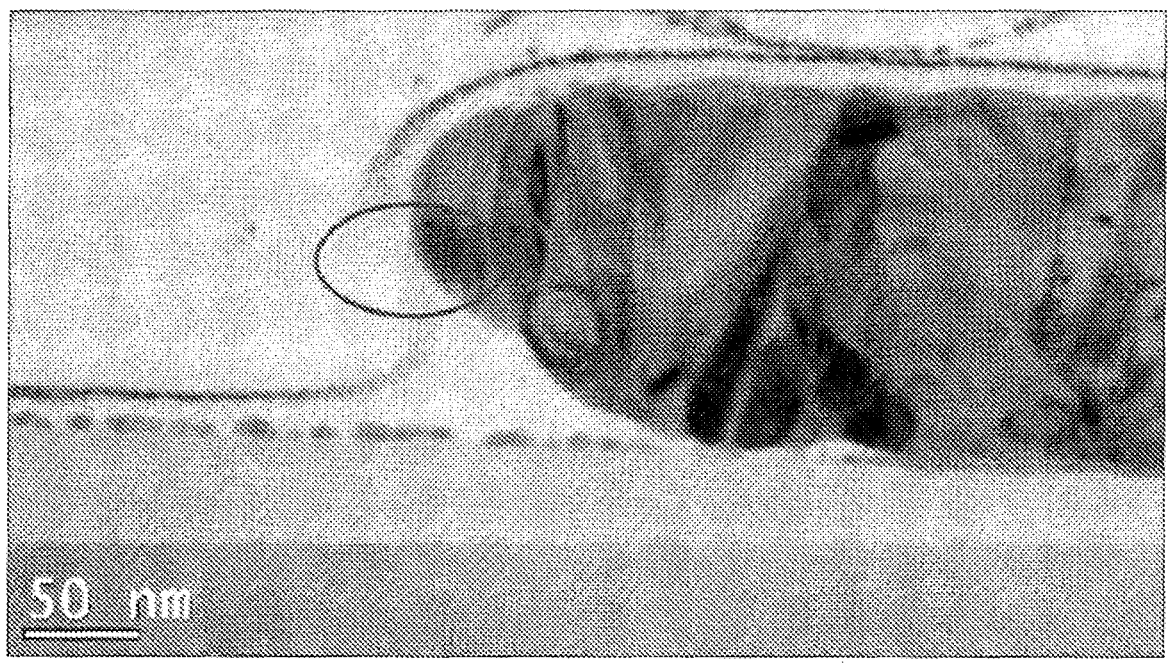
FIG. 20 is a TEM image of a conductive layer and an organic layer of Experimental Example 1.

FIG. 20 is a TEM image of the conductive layer and the organic layer of Experimental Example 1.

Referring to FIG. 20, when a difference between the thickness of the conductive layer and the thickness of the organic layer is about 1200 Å, it can be noted that a thickness of a portion of a conductive layer side surface of the conductive layer exposed to outside the organic layer is secured about 500 Å.

Although embodiments and implementations have been described herein, other embodiments and modifications will be apparent from this description. Accordingly, the invention are not limited to such embodiments, but rather to the broader scope of the appended claims and various obvious modifications and equivalent arrangements as would be apparent to a person of ordinary skill in the art.

What is claimed is:
1. A display device comprising:
a pixel electrode;
a common electrode which faces the pixel electrode;
an auxiliary electrode spaced apart from the pixel electrode and connected to the common electrode; and a first functional layer between the pixel electrode and the common electrode, the first functional layer extending from the pixel electrode to the auxiliary electrode;
wherein the common electrode which is connected to the auxiliary electrode includes;
in order in a direction away from the first functional layer:
a first layer including a transparent conductive material and having a thickness of about 500 angstroms to about 6000 angstroms; and
a second layer including a conductive material; and
among the first layer and the second layer within the common electrode, the second layer comprises portions which are on the pixel electrode and on the auxiliary electrode, respectively, and connected to each other, together with having a thickness of about 10 angstroms to about 100 angstroms.

2. The display device of claim 1, wherein
the auxiliary electrode has a first thickness, and
the first functional layer has a second thickness corresponding to the first thickness of the auxiliary electrode, and
the second thickness less than the first thickness.

3. The display device of claim 2, wherein a difference between the first thickness of the auxiliary electrode and the second thickness of the first functional layer is about 500 angstroms to about 6000 angstroms.

4. The display device of claim 2, wherein
a side surface of the auxiliary electrode is exposed to outside the first functional layer, and
the first layer of the common electrode contacts the side surface of the auxiliary electrode which is exposed to outside the first functional layer.

5. The display device of claim 4, wherein
the auxiliary electrode has a lower surface which extends from the side surface, and
the side surface of the auxiliary electrode forms a taper angle of about 80 degrees to about 90 degrees with the lower surface of the auxiliary electrode.

6. The display device of claim 1, wherein
each of the auxiliary electrode and the pixel electrode includes a material, and
the material of the auxiliary electrode is different from the material of the pixel electrode.

7. The display device of claim 6, wherein the material of the auxiliary electrode includes copper or molybdenum.

8. The display device of claim 1, wherein
each of the auxiliary electrode and the pixel electrode includes a material, and
the material of the auxiliary electrode is the same as the material of the pixel electrode.

9. The display device of claim 1, wherein the first functional layer which extends from the pixel electrode to the auxiliary electrode includes an electron injection layer or an electron transport layer.

10. The display device of claim 1, further comprising:
an emission layer between the pixel electrode and the first functional layer and spaced apart from the auxiliary electrode; and
a second functional layer between the pixel electrode and the emission layer and spaced apart from the auxiliary electrode.

11. The display device of claim 10, wherein the second functional layer includes a hole injection layer or a hole transport layer.

12. A method of providing a display device, the method comprising:

providing a pixel electrode facing a common electrode and an auxiliary electrode which is spaced apart from the pixel electrode and connected to the common electrode;
providing a functional layer between the pixel electrode and the common electrode and extending from the pixel electrode to the auxiliary electrode; and
providing the common electrode by:
providing a first layer of the common electrode which has a thickness of about 500 angstroms to about 6000 angstroms, by providing a transparent conductive material on the functional layer; and
providing a second layer of the common electrode, by providing a conductive material on the first layer of the common electrode,
wherein among the first layer and the second layer within the common electrode, the second layer comprises portions which are on the pixel electrode and on the auxiliary electrode, respectively, and connected to each other, together with having a thickness of about 10 angstroms to about 100 angstroms.

13. The method of claim 12, wherein the providing of the pixel electrode and the auxiliary electrode includes:
providing a first conductive layer including a first material;
providing the auxiliary electrode as a pattern of the first conductive layer;
providing a second conductive layer including a second material different from the first material, on the auxiliary electrode; and
providing the pixel electrode as a pattern of the second conductive layer which is spaced apart from the auxiliary electrode.

14. The method of claim 13, wherein
the auxiliary electrode is provided as the pattern of the first conductive layer, through a first etching process,
the pixel electrode is provided as the pattern of the second conductive layer, through a second etching process,
the second conductive layer has a first etching rate for the second etching process, and
the first conductive layer has a second etching rate for the second etching process which is lower than the first etching rate.

15. The method of claim 13, wherein the second material of the second conductive layer includes copper or molybdenum.

16. The method of claim 12, wherein the providing of the pixel electrode and the auxiliary electrode includes:
providing a conductive layer; and
providing the pixel electrode and the auxiliary electrode as respective patterns of the conductive layer which are spaced apart from each other.

17. The method of claim 12, wherein
the auxiliary electrode has a first thickness, and
the functional layer has a second thickness corresponding to the first thickness of the auxiliary electrode, and
the second thickness less than the first thickness.

18. The method of claim 17, wherein a difference between the first thickness of the auxiliary electrode and the second thickness of the functional layer is about 500 angstroms to about 6000 angstroms.

19. The method of claim 17, wherein
the providing of the functional layer includes vacuum deposition, and
the providing of the first layer of the common electrode includes sputtering.

20. The method of claim 19, wherein the providing of the functional layer exposes a side surface of the auxiliary electrode to outside the functional layer, and the providing of the first layer of the common electrode contacts the first layer with the side surface of the auxiliary electrode which is exposed to outside the functional layer.

21. A display device comprising:

a pixel electrode;

a common electrode which faces the pixel electrode;

an auxiliary electrode spaced apart from the pixel electrode and connected to the common electrode; and a first functional layer between the pixel electrode and the common electrode, the first functional layer extending from the pixel electrode to the auxiliary electrode;

wherein the common electrode which is connected to the auxiliary electrode includes;

in order in a direction away from the first functional layer:

a first layer including a transparent conductive material having a thickness; and a second layer including a conductive material; and among the first layer and the second layer within the common electrode, the second layer comprises portions which are on the pixel electrode and on the auxiliary electrode, respectively, and connected to each other, together with having a thickness smaller than the thickness of the first layer.

22. The display device of claim 21, wherein the thickness of the transparent conductive material is about 500 angstroms to about 6000 angstroms; and the thickness of the conductive material is about 10 angstroms to about 100 angstroms.

\* \* \* \* \*